(12) United States Patent
Minami et al.

(10) Patent No.: US 12,178,125 B2
(45) Date of Patent: *Dec. 24, 2024

(54) PHOTOELECTRIC CONVERSION DEVICE AND SENSOR AND ELECTRONIC DEVICE

(71) Applicant: Samsung Electronics Co., Ltd., Suwon-si (KR)

(72) Inventors: Daiki Minami, Suwon-si (KR); Sung Young Yun, Suwon-si (KR); Kyung Bae Park, Hwaseong-si (KR); Sung Jun Park, Yongin-si (KR); Chul Joon Heo, Busan (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/347,960

(22) Filed: Jul. 6, 2023

(65) Prior Publication Data

US 2023/0354705 A1    Nov. 2, 2023

Related U.S. Application Data

(63) Continuation of application No. 17/070,502, filed on Oct. 14, 2020, now Pat. No. 11,737,360.

(30) Foreign Application Priority Data

Nov. 5, 2019   (KR) .......................... 10-2019-0140289

(51) Int. Cl.
*H10K 30/30* (2023.01)
*H10K 30/81* (2023.01)
(Continued)

(52) U.S. Cl.
CPC ......... *H10K 85/6572* (2023.02); *H10K 30/30* (2023.02); *H10K 30/81* (2023.02);
(Continued)

(58) Field of Classification Search
CPC ...... H01L 31/00–078; Y02E 10/50–60; H10K 30/00–89
(Continued)

(56) References Cited

U.S. PATENT DOCUMENTS

| 8,686,408 B2 | 4/2014 | Yofu et al. |
| 10,381,412 B2 | 8/2019 | Leem et al. |

(Continued)

FOREIGN PATENT DOCUMENTS

| CN | 105669954 A | 6/2016 |
| EP | 3451400 A1 | 3/2019 |

(Continued)

OTHER PUBLICATIONS

Extended European Search Report dated Apr. 14, 2021, issued in corresponding European Patent Application No. 20201312.4.
(Continued)

*Primary Examiner* — Bach T Dinh
(74) *Attorney, Agent, or Firm* — Harness, Dickey & Pierce, P.L.C.

(57) ABSTRACT

Disclosed are a photoelectric conversion device, and a sensor and an electronic device including the same. The photoelectric conversion device may include a first electrode and a second electrode and a photoelectric conversion layer between the first electrode and the second electrode. The photoelectric conversion layer includes a first material and a second material, which form a pn junction, and a third material that is different from the first material and the second material. The third material is configured to modify a distribution of energy levels of the first material or the second material.

19 Claims, 17 Drawing Sheets

(51) Int. Cl.
*H10K 85/40* (2023.01)
*H10K 85/60* (2023.01)
*H10K 102/00* (2023.01)

(52) U.S. Cl.
CPC ........... *H10K 85/40* (2023.02); *H10K 85/631* (2023.02); *H10K 85/654* (2023.02); *H10K 2102/00* (2023.02)

(58) Field of Classification Search
USPC .................................................. 136/243–265
See application file for complete search history.

(56) References Cited

U.S. PATENT DOCUMENTS

| | | | |
|---|---|---|---|
| 11,277,095 | B2 | 3/2022 | Ackermann et al. |
| 11,737,360 | B2* | 8/2023 | Minami ............. H10K 85/6572 |
| 2009/0255529 | A1 | 10/2009 | Liu et al. |
| 2011/0030771 | A1 | 2/2011 | Forrest et al. |
| 2013/0161596 | A1 | 6/2013 | Huang et al. |
| 2016/0149132 | A1* | 5/2016 | Lim ........................ C09B 47/00 546/268.1 |
| 2017/0154929 | A1* | 6/2017 | Leem ................... H10K 85/653 |
| 2018/0006090 | A1 | 1/2018 | Leem et al. |
| 2019/0123285 | A1 | 4/2019 | Shin et al. |
| 2019/0172872 | A1 | 6/2019 | Tsutsumi et al. |
| 2019/0364191 | A1 | 11/2019 | Takahashi et al. |

FOREIGN PATENT DOCUMENTS

| | | |
|---|---|---|
| EP | 3473622 A1 | 4/2019 |
| JP | 2013/254912 A | 12/2013 |
| JP | 2018-129505 A | 8/2018 |
| KR | 2017/0063087 A | 6/2017 |
| KR | 2018/0002272 A | 1/2018 |
| WO | 2018-154039 A1 | 8/2018 |
| WO | WO-2018/147202 A1 | 8/2018 |

OTHER PUBLICATIONS

Office Action for corresponding Korean Patent Application No. 10-2019-0140289 issued on May 29, 2024 and English translation thereof.

Office Action for corresponding Japanese Patent Application No. 2020-177939 issued on Jul. 2, 2024 and English translation thereof.

* cited by examiner

PHOTOELECTRIC CONVERSION DEVICE AND SENSOR AND ELECTRONIC DEVICE

CROSS-REFERENCE TO RELATED APPLICATION

This application is a continuation of U.S. patent application Ser. No. 17/070,502, filed Oct. 14, 2020, which claims priority to and the benefit of Korean Patent Application No. 10-2019-0140289 filed in the Korean Intellectual Property Office on Nov. 5, 2019, the entire contents of each of which are incorporated herein by reference.

BACKGROUND

1. Field

A photoelectric conversion device, a sensor, and an electronic device are disclosed.

2. Description of Related Art

A photoelectric conversion device converts light into an electrical signal using photoelectric effects. The photoelectric conversion device includes a photodiode and a phototransistor, and the like, and it may be applied to a sensor or a photodetector.

Sensors are increasingly demanding higher resolution, resulting in smaller pixel sizes. In the case of silicon photodiodes that are currently used, sensitivity reduction may occur because an absorption area decreases as the pixel size decreases. Accordingly, an organic material that is capable of replacing silicon has been researched.

The organic material may have a high extinction coefficient and be configured to selectively absorb light in a particular wavelength region depending on a molecular structure, and thus may simultaneously replace a photodiode and a color filter and resultantly improve sensitivity and contribute to high integration.

However, organic materials may exhibit different characteristics from silicon due to high binding energy and recombination behavior, and it may be difficult to accurately predict the characteristics of organic materials, which may make it difficult to easily control properties required for photoelectric conversion devices.

SUMMARY

Example embodiments provide a photoelectric conversion device capable of reducing remaining charge carriers and improving charge carrier extraction characteristics.

Example embodiments provide a sensor including the photoelectric conversion device.

Example embodiments provide an electronic device including the photoelectric conversion device or the sensor.

According to example embodiments, a photoelectric conversion device includes a first electrode and a second electrode, and a photoelectric conversion layer between the first electrode and the second electrode. The photoelectric conversion layer includes a first material, a second material, and a third material. The first material and the second material form a pn junction. The third material is different from the first material and the second material and the third material is configured to modify a distribution of energy levels of the first material or the second material.

In some embodiments, a dipole moment of the third material may be greater than or equal to about 5.5 Debye.

In some embodiments; the third material may be configured to modify a distribution of the HOMO energy level of the first material, and the HOMO energy level of the third material may be deeper than the HOMO energy level of the first material or shallower within a range of less than or equal to about 0.3 eV than the HOMO energy level of the first material.

In some embodiments, the HOMO energy level of the third material may be about 4.7 eV to about 6.2 eV, and the HOMO energy level of the first material may be about 5.0 eV to about 5.8 eV.

In some embodiments, the HOMO energy level of the third material may be about 5.1 eV to about 6.0 eV, and the HOMO energy level of the first material may be about 5.0 eV to about 5.8 eV.

In some embodiments, the third material provides a modified HOMO energy level of the first material, and the modified HOMO energy level of the first material may be deeper than the HOMO energy level of the first material.

In some embodiments, the modified HOMO energy level of the first material may be between the HOMO energy level of the first material and a HOMO energy level of the second material.

In some embodiments, an absorption spectrum of the photoelectric conversion layer may have a maximum absorption wavelength in a first wavelength region. The first wavelength region may be one of a blue wavelength region, a green wavelength region, a red wavelength region, and an infra-red wavelength region. Each of the first material and the third material may be a light-absorbing material having a maximum absorption wavelength in the first wavelength region.

In some embodiments, the photoelectric conversion layer may include a mixture of the first material, the second material, and the third material.

In some embodiments, the third material may be included in an amount of less than or equal to about 30% by volume based on a total volume of the first material and the third material.

In some embodiments, a distribution of HOMO energy levels of the photoelectric conversion layer may be different from a distribution of HOMO energy levels of the thin film formed of the first material and the second material.

In some embodiments, the HOMO energy level of the photoelectric conversion layer may be deeper than the HOMO energy level of the thin film formed of the first material and the second material.

In some embodiments, the HOMO energy level of the photoelectric conversion layer may be about 0.001 eV to about 1.2 eV deeper than the HOMO energy level of the thin film formed of the first material and the second material.

In some embodiments, the third material may be an organic material.

In some embodiments, at least one of the first material and the second material may be an organic material.

In some embodiments, the first material may be represented by Chemical Formula A-1,

[Chemical Formula A-1]

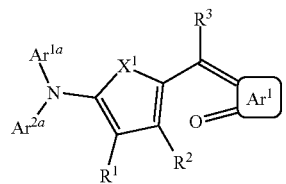

In Chemical Formula A-1,

X$^1$ may be O, S, Se, Te, SO, SO$_2$, SiR$^a$R$^b$, or GeR$^c$R$^d$,

Ar$^1$ may be a substituted or unsubstituted C6 to C30 arylene group, a substituted or unsubstituted C3 to C30 heterocyclic group, or a fused ring including a combination thereof, Ar$^{1a}$ and Ar$^{2a}$ independently may be hydrogen, deuterium, a substituted or unsubstituted C1 to C30 alkyl group, a substituted or unsubstituted C3 to C30 cycloalkyl group, a substituted or unsubstituted C6 to C30 aryl group, or a substituted or unsubstituted C3 to C30 heteroaryl group, Ar$^{1a}$ and Ar$^{2a}$ independently may be present alone or may be linked with each other to form a fused ring, and R$^1$ to R$^3$ and R$^a$ to R$^d$ independently may be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, or a cyano group.

In some embodiments, the second material may include an inorganic material, a thiophene or a thiophene derivative, a fullerene or a fullerene derivative, or a combination thereof.

In some embodiments, the third material may be represented by Chemical Formula 1-1,

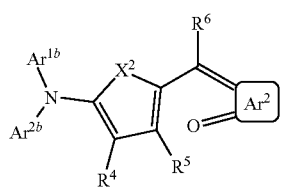

[Chemical Formula 1-1]

In Chemical Formula 1-1,

X$^2$ may be O, S, Se, Te, SO, SO$_2$, SiR$^a$R$^b$, or GeR$^c$R$^d$,

Ar$^2$ may be a substituted or unsubstituted C6 to C30 arylene group, a substituted or unsubstituted C3 to C30 heterocyclic group, or a fused ring including a combination thereof, Ar$^{1b}$ and Ar$^{2b}$ independently may be hydrogen, deuterium, a substituted or unsubstituted C1 to C30 alkyl group, a substituted or unsubstituted C3 to C30 cycloalkyl group, a substituted or unsubstituted C6 to C30 aryl group, or a substituted or unsubstituted C3 to C30 heteroaryl group, Ar$^{1b}$ and Ar$^{2b}$ independently may be present alone or may be linked with each other to form a fused ring, and R$^4$ to R$^6$ and R$^a$ to R$^d$ independently may be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, or a cyano group. According to example embodiments, a photoelectric conversion device includes a first electrode and a second electrode, and a photoelectric conversion layer between the first electrode and the second electrode. The photoelectric conversion layer includes a mixture of a first material, a second material, and a third material. The first material, the second material, and the third material are different from each other. The first material and the third material are light-absorbing materials having a maximum absorption wavelength in a first wavelength region. The first wavelength region is one of a blue wavelength region, a green wavelength region, a red wavelength region, and an infra-red wavelength region. A dipole moment of the third material is greater than or equal to about 5.5 Debye. The third material is included in an amount of less than or equal to about 30 volume % based on a total volume of the first material and the third material.

In some embodiments, the first material and the third material may be a p-type material, and the second material may be an n-type material.

In some embodiments, a HOMO energy level of the third material may be deeper than the HOMO energy level of the first material or the HOMO energy level of the third material may be shallower within a range of less than or equal to about 0.3 eV than a HOMO energy level of the first material.

In some embodiments, the HOMO energy level of the third material may be about 4.7 eV to about 6.2 eV, and the HOMO energy level of the first material may be about 5.0 eV to about 5.8 eV.

In some embodiments, the HOMO energy level of the third material may be about 5.1 eV to about 6.0 eV, and the HOMO energy level of the first material may be about 5.0 eV to about 5.8 eV.

In some embodiments, the third material may be included in an amount of about 1% by volume to about 10% by volume based on a total volume of the first material and the third material.

In some embodiments, the photoelectric conversion layer may be a ternary system composed of the first material, the second material, and the third material.

In some embodiments, the second material may include an inorganic material, a thiophene or a thiophene derivative, a fullerene or a fullerene derivative, or a combination thereof. The first material may be represented by Chemical Formula A-1,

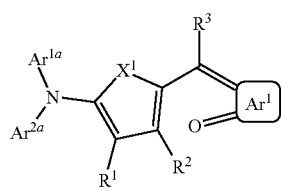

[Chemical Formula A-1]

In Chemical Formula A-1,

X$^1$ may be O, S, Se, Te, SO, SO$_2$, SiR$^a$R$^b$, or GeR$^c$R$^d$,

Ar$^1$ may be a substituted or unsubstituted C6 to C30 arylene group, a substituted or unsubstituted C3 to C30 heterocyclic group, or a fused ring including a combination thereof, Ar$^{1a}$ and Ar$^{2a}$ independently may be hydrogen, deuterium, a substituted or unsubstituted C1 to C30 alkyl group, a substituted or unsubstituted C3 to C30 cycloalkyl group, a substituted or unsubstituted C6 to C30 aryl group, or a substituted or unsubstituted C3 to C30 heteroaryl group, Ar$^{1a}$ and Ar$^{2a}$ independently may be present alone or may be linked with each other to form a fused ring, and R$^1$ to R$^3$ and R$^a$ to R$^d$ independently may be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, or a cyano group.

In some embodiments, the third material may be represented by Chemical Formula 1-1,

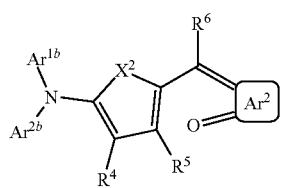

[Chemical Formula 1-1]

In Chemical Formula 1-1, $X^2$ may be O, S, Se, Te, SO, $SO_2$, $SiR^aR^b$, or $GeR^cR^d$, $Ar^2$ may be a substituted or unsubstituted C6 to C30 arylene group, a substituted or unsubstituted C3 to C30 heterocyclic group, or a fused ring including a combination thereof, $Ar^{1b}$ and $Ar^{2b}$ independently may be hydrogen, deuterium, a substituted or unsubstituted C1 to C30 alkyl group, a substituted or unsubstituted C3 to C30 cycloalkyl group, a substituted or unsubstituted C6 to C30 aryl group, or a substituted or unsubstituted C3 to C30 heteroaryl group, $Ar^{1b}$ and $Ar^{2b}$ independently may be present alone or may be linked with each other to form a fused ring, and $R^4$ to $R^6$ and $R^a$ to $R^d$ independently may be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, or a cyano group.

According to example embodiments, a sensor including any one of the above-described the photoelectric conversion devices is provided.

According to example embodiments, an electronic device including any one of the above-described photoelectric conversion devices or sensors is provided.

In example embodiments of inventive concepts, remaining charge carriers may be reduced, and charge carrier extraction characteristics may be improved.

DETAILED DESCRIPTION

Figure 1:
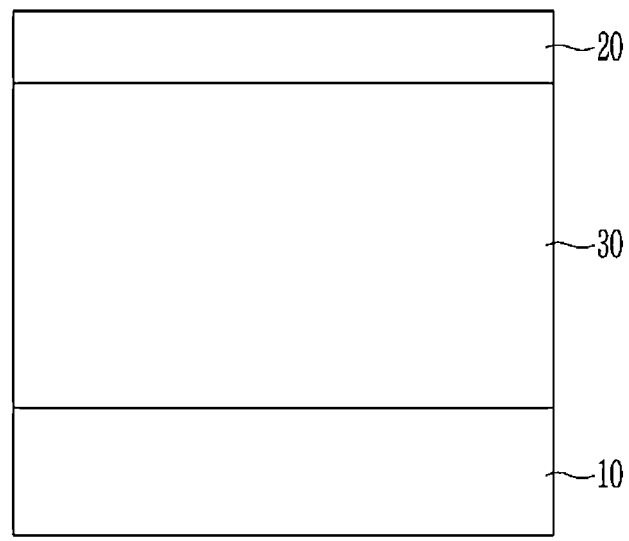
FIG. 1 is a cross-sectional view showing an example of a photoelectric conversion device according to example embodiments.

Example embodiments will hereinafter be described in detail, and may be easily performed by a person skilled in the related art. However, this disclosure may be embodied in many different forms and is not to be construed as limited to the exemplary embodiments set forth herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

Hereinafter, as used herein, when a definition is not otherwise provided, "substituted" refers to replacement of hydrogen of a compound or a group by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when specific definition is not otherwise provided, "hetero" refers to one including 1 to 4 heteroatoms selected from N, O, S, Se, Te, Si, and P.

Hereinafter, "combination" refers to a mixture or a stacked structure of two or more.

As used herein, when specific definition is not otherwise provided, an energy level refers to the highest occupied molecular orbital (HOMO) energy level and the lowest unoccupied molecular orbital (LUMO) energy level. As used herein, "the HOMO energy level of the first material" or "the original HOMO energy level of the first material" are used exchangeably, both referring to the HOMO energy level of the first material which is not modified by the third material.

Hereinafter, a work function or an energy level is expressed as an absolute value from a vacuum level. In addition, when the work function or the energy level is referred to be deep, high, or large, it may have a large absolute value based on "0 eV" of the vacuum level while when the work function or the energy level is referred to be shallow, low, or small, it may have a small absolute value based on "0 eV" of the vacuum level.

Hereinafter, when specific definition is not otherwise provided, the work function and the energy level may be values calculated by Turbomole using a B3LYP/def2-SVP basis set.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, a photoelectric conversion device according to an embodiment is described with reference to the drawings.

FIG. 1 is a cross-sectional view showing an example of a photoelectric conversion device according to example embodiments.

Referring to FIG. 1, a photoelectric conversion device 100 according to example embodiments includes a first electrode 10, a second electrode 20, and a photoelectric conversion layer 30.

A substrate (not shown) may be disposed at the side of the first electrode 10 or the second electrode 20. The substrate may be for example made of an inorganic material such as glass, a silicon wafer, or an organic material such as polycarbonate, polymethylmethacrylate, polyethyleneterephthalate, polyethylenenaphthalate, polyamide, polyethersulfone, or a combination thereof.

The substrate may be omitted.

One of the first electrode 10 and the second electrode 20 is an anode and the other is a cathode. For example, the first electrode 10 may be an anode and the second electrode 20 may be a cathode. For example, the first electrode 10 may be a cathode and the second electrode 20 may be an anode.

At least one of the first electrode 10 and the second electrode 20 may be a transparent electrode. Herein, the transparent electrode may have a high light transmittance of greater than or equal to about 80%. The transparent electrode may include for example at least one of an oxide conductor, a carbon conductor, and a metal thin film. The oxide conductor may include for example at least one of indium tin oxide (ITO), indium zinc oxide (IZO), zinc tin oxide (ZTO), aluminum tin oxide (AlTO), and aluminum zinc oxide (AZO), the carbon conductor may include at least one of graphene and carbon nanostructures, and the metal thin film may be a very thin film including aluminum (Al), magnesium (Mg), silver (Ag), gold (Au), an alloy thereof, or a combination thereof.

One of the first electrode 10 and the second electrode 20 may be a reflective electrode. Herein, the reflective electrode may have, for example, a light transmittance of less than about 10% or high reflectance of greater than or equal to about 5%. The reflective electrode may include a reflective conductor such as a metal and may include, for example aluminum (Al), silver (Ag), gold (Au), or an alloy thereof.

For example, each of the first electrode 10 and the second electrode 20 may be a transparent electrode, and one of the first electrode 10 and the second electrode 20 may be a light-receiving electrode.

For example, the first electrode 10 may be a transparent electrode, the second electrode 20 may be a reflective electrode, and the first electrode 10 may be a light-receiving electrode.

For example, the first electrode 10 may be a reflective electrode, the second electrode 20 may be a transparent electrode, and the second electrode 20 may be a light-receiving electrode.

The photoelectric conversion layer 30 may be disposed between the first electrode 10 and the second electrode 20. The second electrode 20 may be on the first electrode 10.

The photoelectric conversion layer 30 may be configured to absorb light in at least one part in a wavelength region and may be configured to convert the absorbed light into an electrical signal. The absorbed light may be configured to convert, for example, a portion of light in a blue wavelength region (hereinafter, referred to as "blue light"), light in a green wavelength region (hereinafter, referred to as "green light"), light in a red wavelength region (hereinafter, referred to as "red light"), and/or light in an infra-red wavelength region (hereinafter, referred to as "infra-red light") into an electrical signal.

For example, the photoelectric conversion layer 30 may be configured to selectively absorb at least one of the blue light, the green light, the red light, and the infra-red light and to convert the absorbed light an electrical signal. Herein, the selective absorption of at least one of the blue light, the green light, the red light, and the infra-red light may mean that an absorption spectrum has a maximum absorption wavelength ($\lambda_{max}$) in one of the wavelength regions of greater than or equal to about 380 nm and less than about 500 nm, about 500 nm to about 600 nm, greater than about 600 nm and less than or equal to about 700 nm, and greater than about 700 nm and less than or equal to about 3000 nm, and an absorption spectrum in the corresponding wavelength region may be remarkably higher than those in the other wavelength regions. Herein "significantly high" may mean that about 70% to about 100%, about 75% to about 100%, about 80% to about 100%, about 85% to about 100%, about 90% to about 100%, or about 95% to about 100% relative to a total area of the absorption spectrum may belong to the corresponding wavelength region.

The photoelectric conversion layer 30 may include a first material and a second material forming a pn junction, and the first material and the second material may receive light from the outside to generate excitons. The generated excitons may be separated into holes and electrons. For example, the first material may be a p-type material and the second material may be an n-type material.

For example, each of the first material and the second material may be a light-absorbing material, and for example, at least one of the first material and the second material may be an organic light-absorbing material. For example, at least one of the first material and the second material may be a light-absorbing material having wavelength selectivity which is configured to selectively absorb light in a desired (and/or alternatively predetermined) wavelength region. For example, at least one of the first material and the second material may be an organic light-absorbing material having wavelength selectivity. The absorption spectrum of the first material and the second material may have a maximum absorption wavelength ($\lambda_{max}$) in the same or different wavelength regions.

For example, the first material and the second material may be configured to independently selectively absorb one of blue light, green light, red light, and infra-red light. The maximum absorption wavelengths ($\lambda_{max}$) of absorption spectra of the first material and the second material may be present in one of the wavelength regions of greater than or equal to about 380 nm and less than about 500 nm, about 500 nm to about 600 nm, greater than about 600 nm and less than or equal to about 700 nm, and greater than about 700 nm and less than or equal to about 3000 nm.

For example, the first material and/or the second material may be an organic material.

For example, the first material and/or the second material may be a small molecule compound.

For example, the first material and/or the second material may be a depositable compound.

For example, the first material may be an organic material that has a core structure including an electron donating moiety (EDM), a π-conjugated linking moiety, and an electron accepting moiety (EMA).

The first material may be for example represented by Chemical Formula A, but is not limited thereto.

EDM1-HA1-EAM1 [Chemical Formula A]

In Chemical Formula A,

HA1 may be a substituted or unsubstituted C2 to C30 heterocyclic group as the π-conjugated linking moiety, EDM1 may be an electron donating moiety, and EAM1 may be an electron accepting moiety.

For example, the first material represented by Chemical Formula A may be, for example represented by Chemical Formula A-1, but is not limited thereto.

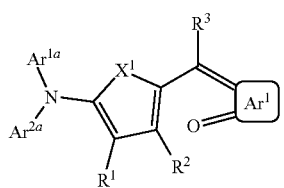

[Chemical Formula A-1]

In Chemical Formula A-1, $X^1$ may be O, S, Se, Te, SO, SO$_2$, SiR$^a$R$^b$, or GeR$^c$R$^d$, Ar$^1$ may be a substituted or unsubstituted C6 to C30 arylene group, a substituted or unsubstituted C3 to C30 heterocyclic group, or a fused ring of the foregoing two or more (e.g., a fused ring including a combination thereof), Ar$^{1a}$ and Ar$^{2a}$ may independently be hydrogen, deuterium, a substituted or unsubstituted C1 to C30 alkyl group, a substituted or unsubstituted C3 to C30 cycloalkyl group, a substituted or unsubstituted C6 to C30 aryl group, or a substituted or unsubstituted C3 to C30 heteroaryl group, Ar$^{1a}$ and Ar$^{2a}$ may independently be present alone or may be linked with each other to form a fused ring, and R$^1$ to R$^3$ and R$^a$ to R$^d$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, or a cyano group.

For example, in Chemical Formula A-1, Ar$^{1a}$ and Ar$^{2a}$ may independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, or a substituted or unsubstituted pyridopyridazinyl group.

For example, Ar$^{1a}$ and Ar$^{2a}$ of Chemical Formula A-1 may be linked with each other to form a ring, and for example, Ar$^{1a}$ and Ar$^{2a}$ may be linked with each other by one of a single bond, —O—, —S—, —Se—, —Te—, —N=, —NR$^e$—, —(CR$^f$R$^g$)$_{n2}$— (where n2 is 1 or 2), —SiR$^h$R$^i$—, —GeR$^j$R$^k$—, —(C(R$^l$)=C(R$^m$))—, or SnR$^n$R$^o$ to form a ring. Herein, R$^e$ to R$^o$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, or a cyano group. Also, R$^f$ and R$^g$, R$^h$ and R$^i$, R$^j$ and R$^k$, R$^l$ and R$^m$, and R$^n$ and R$^o$ may independently be present alone or linked with each other to form a ring. For example, R$^f$ and R$^g$ may be linked with each other to form a ring, R$^h$ and R$^i$ may be linked with each other to form a ring, R$^j$ and R$^k$ may be linked with each other to form a ring, R$^l$ and R$^m$ may be linked with each other to form a ring, and/or R$^n$ and R$^o$ may be linked with each other to form a ring.

For example, the first material represented by Chemical Formula A-1 may be, for example represented by Chemical Formulae A-2 to A-5, but is not limited thereto.

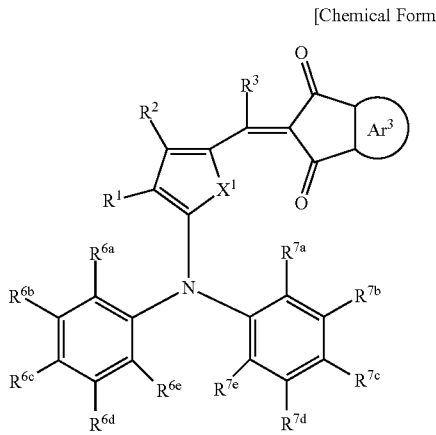

[Chemical Formula A-2]

[Chemical Formula A-3]

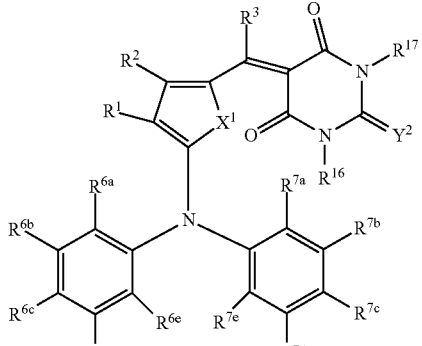

[Chemical Formula A-4]

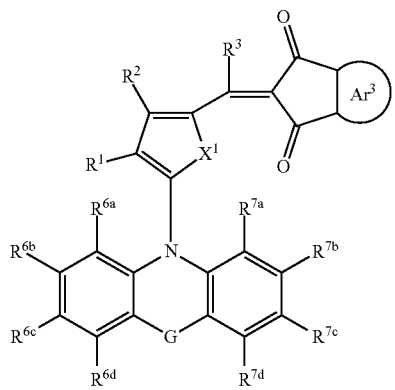

[Chemical Formula A-5]

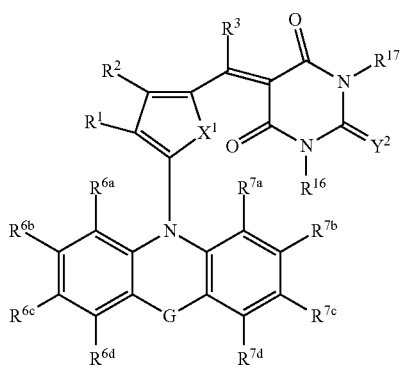

In Chemical Formulae A-2 to A-5, $X^1$ and $R^1$ to $R^3$ are the same as described above for Chemical Formula A-1, $Ar^3$ may be a substituted or unsubstituted C6 to C30 arylene group, a substituted or unsubstituted C3 to C30 heterocyclic group, or a fused ring of the foregoing two or more (e.g., a fused ring including a combination thereof), G may be one of a single bond, —O—, —S—, —Se—, —Te—, —N=, —NR$^e$—, —(CR$^f$R$^g$)$_{n2}$-(where n2 is 1 or 2), —SiR$^h$R$^i$—, —GeR$^j$R$^k$—, —(C(R$^l$)=C(R$^m$))—, or SnR$^n$R$^o$, wherein R$^e$ to R$^o$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, or a cyano group, and R$^f$ and R$^g$, R$^h$ and R$^i$, R$^j$ and R$^k$, R$^l$ and R$^m$, and R$^n$ and R$^o$ may independently be present alone or linked with each other to form a ring, $Y^2$ may be O, S, Se, Te, or C(RP)(CN) (wherein RP is hydrogen, a cyano group (—CN), or a C1 to C10 alkyl group), R$^{6a}$ to R$^{6e}$, R$^{7a}$ to R$^{7e}$, R$^{16}$, and R$^{17}$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, or a cyano group, R$^{6a}$ to R$^{6e}$ may independently be present alone or an adjacent two thereof may be linked with each other to provide a fused ring, and R$^{7a}$ to R$^{7e}$ may independently be present alone or an adjacent two thereof may be linked with each other to provide a fused ring.

For example, Ar$^3$ of Chemical Formula A-2 or A-4 may be benzene, naphthalene, anthracene, thiophene, selenophene, tellurophene, pyridine, pyrimidine, or a fused ring of the foregoing two or more.

The second material may include, for example, an organic material, an inorganic material and/or organic/inorganic material, and may be, for example, thiophene or a thiophene derivative, fullerene or a fullerene derivative, but is not limited thereto. The thiophene derivative or the fullerene derivative may be those commonly used in the art and may refer to a thiophene or fullerene compound having a substituent. The substituent may include, for example, a C1 to C30 alkyl group (e.g., a C1 to C20 alkyl group, or a C1 to C10 alkyl group), a C6 to C30 aryl group (e.g., a C6 to C20 aryl group, or a C6 to C12 aryl group), or the like.

The photoelectric conversion layer 30 further includes a third material. The third material may be a material different from the first material and the second material, and may be a dopant for modifying physical properties of the first material and/or the second material in the photoelectric conversion layer 30.

The third material may be mixed with the first material and the second material, and thus the third material may be in contact with the first material and/or the second material on an atomic scale to modify morphologies of the first material and/or the second material or molecular conformations of the first material and the second material. Accordingly, diversities of the morphology and the diversity of molecular conformation of the photoelectric conversion layer 30 including the first material, the second material, and the third material may be different from the morphology and the diversity of molecular conformation of a thin film made of the first material and the second material (without the third material).

According to a quantum calculation based on such a morphology, the third material having the high dipole moment may be configured to modify the distribution of energy levels of the first material and/or the second material. For example, the third material having the high dipole moment may be configured to modify a distribution of the HOMO energy level or a distribution of the LUMO energy level of the first material or the second material. Accordingly, the distribution of the HOMO energy level or the distribution of the LUMO energy level of the photoelectric conversion layer 30 including the first material, the second material, and the third material may be different from distribution of the HOMO energy level or the distribution of the LUMO energy level of a thin film composed of the first material and the second material (without the third material).

The dipole moment of the third material may be for example greater than or equal to about 5.5 Debye, greater than or equal to about 6 Debye, greater than or equal to about 8 Debye, greater than or equal to about 10 Debye, or greater than or equal to about 12 Debye, or within the range of about 5.5 Debye to about 15 Debye, about 6 Debye to about 15 Debye, about 8 Debye to about 15 Debye, about 10 Debye to about 15 Debye, or about 12 Debye to about 15 Debye, but is not limited thereto.

The photoelectric conversion layer 30 includes the third material having a high dipole moment as a dopant and thus may be adjusted, so that the first material or the second material may have the distributions of HOMO or LUMO energy levels in a desired region or may not have the distributions of the HOMO or LUMO energy levels in an undesired region.

For example, when the first material is a p-type material and the second material is an n-type material, the third material may be a p-type material that modifies the distribution of HOMO energy levels of the first material. For example, the distribution of the HOMO energy levels of the first material modified by the third material may be shifted toward a deeper HOMO energy level direction compared with the original distribution of the HOMO energy levels of the first material.

In this way, as the distribution of the HOMO energy levels of the first material of the p-type material is shifted, the desired region of the distribution of the HOMO energy levels may be increased, or the undesired region of the distribution of the HOMO energy levels may be reduced or excluded. For example, regions of shallow HOMO energy levels of the p-type material in which relatively lots of trap sites of charge carriers (e.g., holes) are present in the regions of the distribution of the HOMO energy levels thereof may be reduced or excluded. For example, regions of shallower HOMO energy levels than about 5.2 eV in the distribution of the HOMO energy levels of the p-type material may be reduced or excluded.

For example, the distribution of the HOMO energy levels of the first material modified by the third material may be shifted toward a deeper HOMO energy level direction. Herein, the third material may have a deeper or shallower HOMO energy level than HOMO energy level of the first material. For example, the HOMO energy level of the third material may be deeper than HOMO energy level of the first material or the HOMO energy level of the third material may be shallower than HOMO energy level of the first material within a range of less than or equal to about 0.3 eV, for example, the HOMO energy level of the third material may be in a range of about −0.3 eV to about 1.2 eV (excluding 0 eV) compared with HOMO energy level of the first material. For example, the original HOMO energy level of first material may be in a range of about 5.0 eV to about 5.8 eV, and the HOMO energy level of the third material may be in a range of about 4.7 eV to about 6.2 eV. For example, the HOMO energy level of the third material may be deeper than the original HOMO energy level of the first material, for example, the original HOMO energy level of the first material may be in a range of about 5.0 eV to about 5.8 eV, and the HOMO energy level of the third material may be in a range of about 5.1 eV to about 6.2 eV. The HOMO energy levels of the first material modified by the third material may be deeper than the original energy level of the first material. For example, the HOMO energy levels of the first material modified by the third material may be, for example, greater than or equal to about 0.001 eV deeper, for example, about 0.001 eV to about 1.2 eV deeper, about 0.002 eV to about 0.8 eV deeper, about 0.003 eV to about 0.4 eV deeper, about 0.004 eV to about 0.1 eV deeper, about 0.005 eV to about 0.08 eV deeper, about 0.005 eV to about 0.04 eV deeper, about 0.005 eV to about 0.03 eV deeper, about 0.005 eV to about 0.02 eV deeper, or about 0.005 eV to about 0.018 eV than the original energy level of the first material.

For example, the HOMO energy level of the second material as an n-type material may be deeper than about 6.2 eV, and the HOMO energy level of the third material may be between the HOMO energy level of the first material and the HOMO energy level of the second material. For example, a difference between the HOMO energy level of the third material and the HOMO energy level of the second material may be smaller than a difference between the HOMO energy level of the first material and the HOMO energy level of the second material. For example, the original HOMO energy level of the first material may be in a range of about 5.0 eV to about 5.8 eV, the HOMO energy level of the second material may be in a range of about 6.3 eV to about 7.2 eV, and the HOMO energy level of the third material may be in a range of about 5.1 eV to about 6.2 eV.

Accordingly, the HOMO energy level of the photoelectric conversion layer 30 including the first, second, and third materials may be deeper than that of a thin film formed of the first and second materials (without the third material), for example, greater than or equal to about 0.001 eV deeper, for example, about 0.001 eV to about 1.2 eV deeper, about 0.002 eV to about 0.8 eV deeper, about 0.003 eV to about 0.4 eV deeper, about 0.004 eV to about 0.1 eV deeper, about 0.005 eV to about 0.08 eV deeper, about 0.005 eV to about 0.04 eV deeper, about 0.005 eV to about 0.03 eV deeper, about 0.005 eV to about 0.02 eV deeper, or about 0.005 eV to about 0.018 eV deeper than that of a thin film formed of the first and second materials (without the third material).

The third material may be an organic material, an inorganic material and/or organic/inorganic material which have the aforementioned characteristics. The third material may be for example an organic material, for example small molecule compound, for example a depositable organic compound. For example, the photoelectric conversion layer 30 may be a co-deposited thin film of the first material, the second material, and the third material.

The third material may be, for example, a light-absorbing material, and may be, for example, a light-absorbing material configured to selectively absorb one of light in a blue wavelength region, a green wavelength region, a red wavelength region, and an infra-red wavelength region.

For example, the absorption spectra of the first material and the third material may have a maximum absorption wavelength ($\lambda_{max}$) that in common belongs to one of a blue wavelength region, a green wavelength region, a red wavelength region, and an infra-red wavelength region. For example, the absorption spectra of the first material and the third material may have each maximum absorption wavelength ($\lambda_{max}$) in a blue wavelength region of greater than or equal to about 380 nm and less than about 500 nm. For example, the absorption spectra of the first material and the third material may have each maximum absorption wavelength ($\lambda_{max}$) in a green wavelength region of about 500 nm to about 600 nm. For example, the absorption spectra of the first material and the third material may have each maximum absorption wavelength ($\lambda_{max}$) in a red wavelength region of greater than about 600 nm and less than or equal to about 700 nm. For example, the absorption spectra of the first material and the third material may have each maximum absorption wavelength ($\lambda_{max}$) in an infra-red wavelength region of greater than about 700 nm and less than or equal to about 3000 nm.

The third material may be, for example, represented by Chemical Formula 1, but is not limited thereto.

EDM3-HA3-EAM3 [Chemical Formula 1]

In Chemical Formula 1,
HA3 may be a substituted or unsubstituted C2 to C30 heterocyclic group as a π-conjugated linking moiety,
EDM3 may be an electron donating moiety, and
EAM3 may be an electron accepting moiety.

For example, HA3 may be the same as or different from HA1 described above, EDM3 may be the same as or different from EDM1 described above, and EAM3 may be the same as or different from EAM1 described above. However, at least one of HA3, EDM3, and EAM3 may be different from HA1, EDM1, or EAM1.

For example, the third material represented by Chemical Formula 1 may be, for example represented by Chemical Formula 1-1, but is not limited thereto.

[Chemical Formula 1-1]

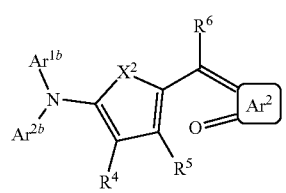

In Chemical Formula 1-1,
$X^2$ may be O, S, Se, Te, SO, $SO_2$, $SiR^aR^b$, or $GeR^cR^d$,
$Ar^2$ may be a substituted or unsubstituted C6 to C30 arylene group, a substituted or unsubstituted C3 to C30 heterocyclic group, or a fused ring of the foregoing two or more,
$Ar^{1b}$ and $Ar^{2b}$ may independently be hydrogen, deuterium, a substituted or unsubstituted C1 to C30 alkyl group, a substituted or unsubstituted C3 to C30 cycloalkyl group, a substituted or unsubstituted C6 to C30 aryl group, or a substituted or unsubstituted C3 to C30 heteroaryl group,
$Ar^{1b}$ and $Ar^{2b}$ may independently be present alone or may be linked with each other to form a fused ring, and
$R^4$ to $R^6$ and $R^a$ to $R^d$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, or a cyano group.

For example, in Chemical Formula 1-1, $Ar^{1b}$ and $Ar^{2b}$ may independently be a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, and a substituted or unsubstituted pyridopyridazinyl group.

For example, $Ar^{1b}$ and $Ar^{2b}$ of Chemical Formula 1-1 may be linked with each other to form a ring or for example, $Ar^{1b}$ and $Ar^{2b}$ may be linked with each other by one of a single bond, —O—, —S—, —Se—, —Te—, —N=, —NR$^e$—, —(CR$^f$R$^g$)$_{n2}$— (where n2 is 1 or 2), —SiR$^h$R$^i$, —GeR$^j$R$^k$—, —(C(R$^l$)=C(R$^m$))—, or SnR″R°. Herein, R$^e$ to R° are each independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, or a cyano group. Also, R$^f$ and R$^g$, R$^h$ and R$^i$, R$^j$ and R$^k$, R$^l$ and R$^m$, and R″ and R° may independently be present alone or linked with each other to form a ring.

For example, the third material represented by Chemical Formula 1-1 may be for example represented by Chemical Formulae 1-2 to 1-7, but is not limited thereto.

[Chemical Formula 1-2]

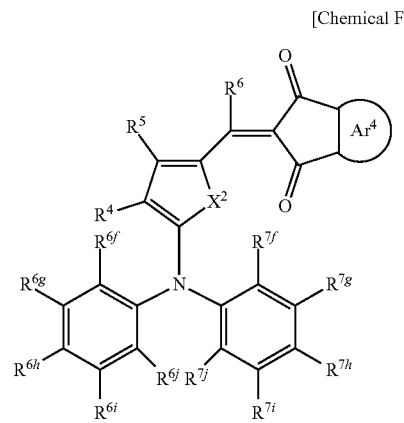

[Chemical Formula 1-3]

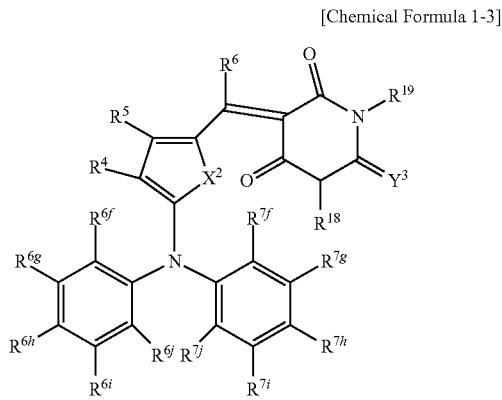

[Chemical Formula 1-4]

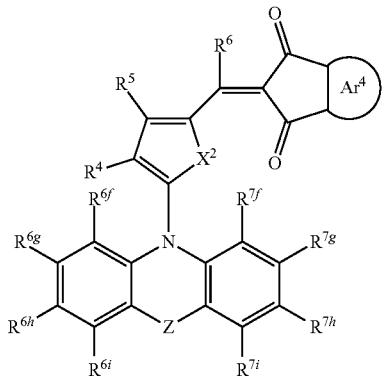

[Chemical Formula 1-5]

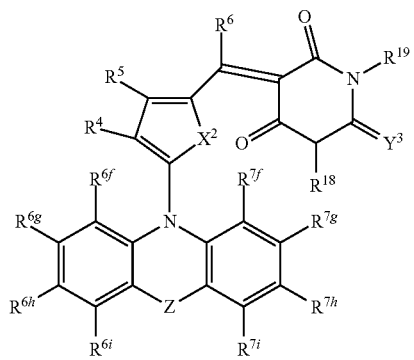

[Chemical Formula 1-6]

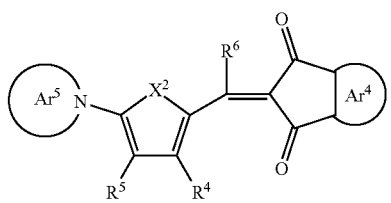

[Chemical Formula 1-7]

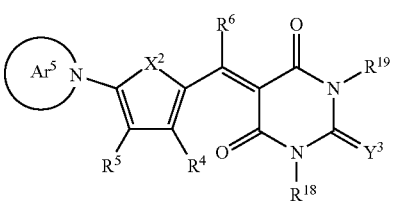

In Chemical Formulae 1-2 to 1-7, $X^2$ and $R^4$ to $R^6$ are the same as described above for Chemical Formula 1-1, $Ar^4$ may be a substituted or unsubstituted C6 to C30 arylene group, a substituted or unsubstituted C3 to C30 heterocyclic group, or a fused ring of the foregoing two or more, $Ar^5$ may be a substituted or unsubstituted C3 to C30 cycloalkyl group, Z may be a single bond, —O—, —S—, —Se—, —Te—, —N=, —NR$^e$—, —(CR$^f$R$^g$)$_{n2}$— (where n2 is 1 or 2), —SiR$^h$R$^i$—, —GeR$^j$R$^k$—, —(C(R$^l$)=C(R$^m$))—, or SnR$^n$R$^o$, wherein R$^e$ to R$^o$ may independently be hydrogen, deuterium, a substituted or unsubstituted C1 to C30 alkyl group, a substituted or unsubstituted C1 to C30 alkoxy group, a substituted or unsubstituted C6 to C12 aryl group, a substituted or unsubstituted C3 to C30 heteroaryl group, a halogen, or a cyano group, and R$^f$ and R$^g$, R$^h$ and R$^i$, R$^j$ and R$^k$, R$^l$ and R$^m$, and R$^n$ and R$^o$ may independently be present alone or linked with each other to form a ring, $Y^3$ may be O, S, Se, Te, or C(RP)(CN) (wherein RP is hydrogen, a cyano group (—CN), or a C1 to C10 alkyl group), $R^{6f}$ to $R^{6j}$, $R^{7f}$ to $R^{7j}$, $R^{18}$, and $R^{19}$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, or a cyano group, $R^{6f}$ to $R^{6j}$ may independently be present alone or an adjacent two thereof may be linked with each other to provide a fused ring, and $R^{7f}$ to $R^{7j}$ may independently be present alone or an adjacent two thereof may be linked with each other to provide a fused ring.

For example, $Ar^4$ of Chemical Formula 1-2, 1-4, or 1-6 may be benzene, naphthalene, anthracene, thiophene, selenophene, tellurophene, pyridine, pyrimidine, or a fused ring of the foregoing two or more.

The photoelectric conversion layer 30 may be an intrinsic layer in which the aforementioned first, second, and third materials are mixed in the form of a bulk heterojunction.

The first material and the second material may be mixed in a volume ratio of about 1:9 to about 9:1, for example about 2:8 to about 8:2, about 3:7 to about 7:3, about 4:6 to about 6:4, or about 5:5.

The third material may be included in an amount that does not affect stability of the molecules of the first material and the second material and other properties required in the photoelectric conversion layer 30, in addition to modifying physical properties of the first material and/or the second material. The third material may be included in an amount that is less than the first material or the second material. For example, the third material may be included in less than or equal to about 30% by volume, within the range, about 1% by volume to about 30% by volume, about 1% by volume to about 25% by volume, about 1% by volume to about 20% by volume, about 1% by volume to about 15% by volume, or about 1% by volume to about 10% by volume based on a total volume of the first material and the third material.

For example, the photoelectric conversion layer 30 may be a ternary system composed of the first material, the second material, and the third material.

The photoelectric conversion device 100 may further include an anti-reflection layer (not shown) on the first electrode 10 or under the second electrode 20. The anti-reflection layer may be disposed at a light incidence side and lower reflectance of light of incident light and thereby light absorbance may be further improved. For example, when light is incident to the first electrode 10, the anti-reflection layer may be disposed on the first electrode 10, and when light is incident to the second electrode 20, anti-reflection layer may be disposed under the second electrode 20.

The anti-reflection layer may include, for example a material having a refractive index of about 1.6 to about 2.5, and may include for example at least one of metal oxide, metal sulfide, and an organic material having a refractive index within the ranges. The anti-reflection layer may include, for example a metal oxide such as aluminum-containing oxide, molybdenum-containing oxide, tungsten-containing oxide, vanadium-containing oxide, rhenium-containing oxide, niobium-containing oxide, tantalumcontaining oxide, titanium-containing oxide, nickel-containing oxide, copper-containing oxide, cobalt-containing oxide, manganese-containing oxide, chromium-containing oxide, tellurium-containing oxide, or a combination thereof; metal sulfide such as zinc sulfide; or an organic material such as an amine derivative, but is not limited thereto.

In the photoelectric conversion device 100, when light enters from the first electrode 10 or the second electrode 20 and the photoelectric conversion layer 30 may be configured to absorb light in a desired (and/or alternatively predetermined) wavelength region, excitons may be produced there-inside. The excitons are separated into holes and electrons in the photoelectric conversion layer 30, and the separated holes are transported to an anode that is one of the first electrode 10 and the second electrode 20 and the separated electrons are transported to the cathode that is the other of the first electrode 10 and the second electrode 20 so as to flow a current.

Herein, as described above, the photoelectric conversion layer 30 further includes the third material capable of modifying properties of the first material and/or the second material, in addition to the first and second materials forming pn junctions, and thus may realize desired properties or exclude undesired properties. Accordingly, the optoelectric characteristics of the photoelectric conversion device 100 may be improved. For example, as described above, the distribution of the energy levels of the first material or the second material may be reduced or adjusted, so that regions of energy levels in which relatively lots of trap sites of charge carriers are present in the photoelectric conversion layer 30 (e.g., regions of shallow HOMO energy levels) may be reduced or excluded and thus remaining charge carriers may be reduced or prevented from staying or being trapped at the trap sites among charge carriers moving from the photoelectric conversion layer 30 to the first electrode 10 and/or the second electrode 20. Accordingly, an after-image (an image sticking) due to the remaining charge carriers accumulated in the photoelectric conversion layer 30 may be reduced or prevented, resultantly, improving electrical performance of the photoelectric conversion device 100.

Figure 2:
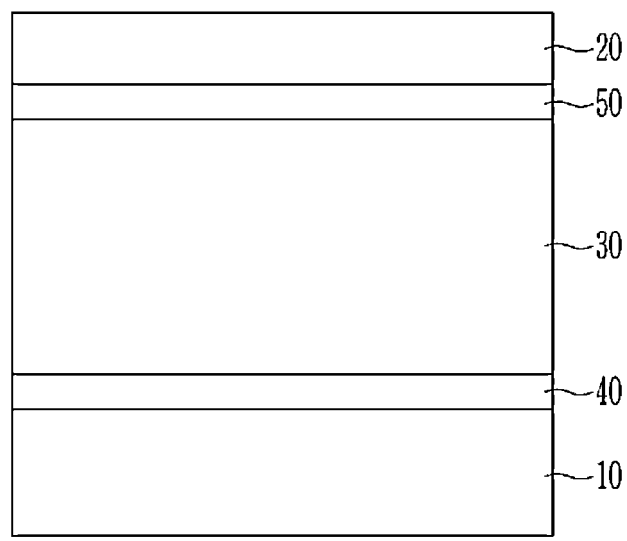
FIG. 2 is a cross-sectional view showing another example of a photoelectric conversion device according to example embodiments.

FIG. 2 is a cross-sectional view showing another example of a photoelectric conversion device according to example embodiments.

Referring to FIG. 2, a photoelectric conversion device 100 according to the embodiment includes a first electrode 10, a second electrode 20, and a photoelectric conversion layer 30, like the aforementioned embodiment. However, the photoelectric conversion device 100 according to the present embodiment may further include auxiliary layers 40 and 50 between the first electrode 10 and the photoelectric conversion layer 30 and between the second electrode 20 and the photoelectric conversion layer 30, unlike the aforementioned embodiment.

The auxiliary layers 40 and 50 may include a hole injecting layer (HIL) to facilitate the injection of holes, a hole transporting layer (HTL) to facilitate the transport of holes, an electron blocking layer (EBL) to block movement of electrons, electron injecting layer (EIL) to facilitate the injection of electrons, electron transporting layer (ETL) to facilitate the transport of electrons, and/or a hole blocking layer (HBL) to block movement of holes, but are not limited thereto.

The auxiliary layers 40 and 50 may independently include an organic material, an inorganic material and/or organic/inorganic material.

For example, one of the auxiliary layers 40 and 50 may include an inorganic auxiliary layer. The inorganic auxiliary layer may include, for example, a lanthanide element, calcium (Ca), potassium (K), aluminum (Al), or an alloy thereof, and the lanthanide element may include, for example, ytterbium (Yb). The inorganic auxiliary layer may have a thickness of less than or equal to about 5 nm.

For example, one of the auxiliary layers 40 and 50 may include an organic auxiliary layer. The organic auxiliary layer may include, for example, a compound represented by Chemical Formula 2A or 2B, but is not limited thereto.

[Chemical Formula 2A]

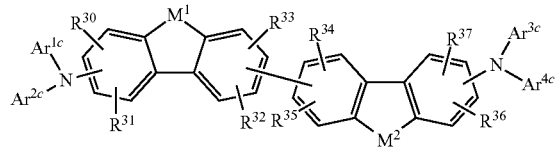

[Chemical Formula 2B]

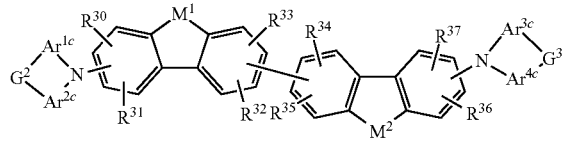

In Chemical Formula 2A or 2B, $M^1$ and $M^2$ may independently be O, S, Se, Te, $CR^qR^r$, $SiR^sR^t$, or $NR^u$, $Ar^{1c}$, $Ar^{2c}$, $Ar^{3c}$, and $Ar^{4c}$ may independently be a substituted or unsubstituted C6 to C30 aryl group or a substituted or unsubstituted C3 to C30 heteroaryl group, $G^2$ and $G^3$ may independently be a single bond, $-(CR^vR^w)_{n3}-$, $-O-$, $-S-$, $-Se-$, $-Te-$, $-N=$, $-NR^x-$, or $-SiR^yR^z-$, wherein n3 is 1 or 2, and $R^{30}$ to $R^{37}$ and $R^q$ to $R^z$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a halogen, or a cyano group.

For example, the organic auxiliary layer may include a compound represented by Chemical Formula 2A-1 or 2B-1, but is not limited thereto.

[Chemical Formula 2A-1]

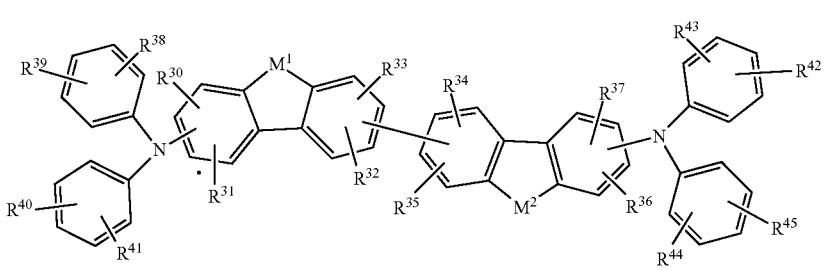

[Chemical Formula 2B-1]

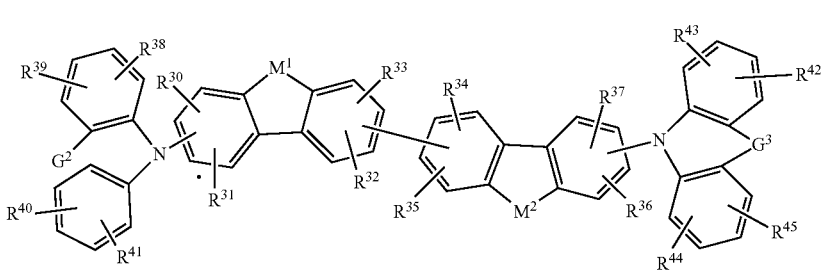

In Chemical Formula 2A-1 or 2B-1, $M^1$, $M^2$, $G^2$, $G^3$, and $R^{31}$ to $R^{37}$ are the same as described above, $R^{38}$ to $R^{45}$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, or a cyano group.

For example, the organic auxiliary layer may include a compound represented by Chemical Formula 2A-1a or 2B-1a, but is not limited thereto.

[Chemical Formula 2A-1a]

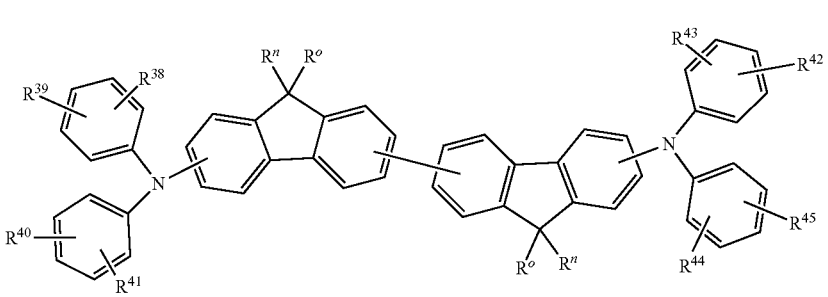

[Chemical Formula 2B-1a]

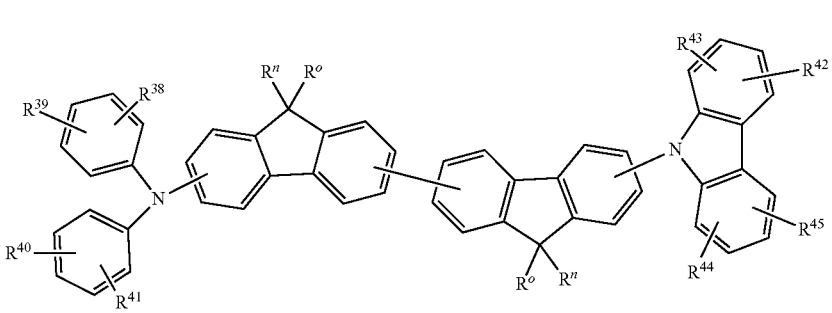

In Chemical Formula 2A-1a and 2B-1a, $R^{38}$ to $R^{45}$ are the same as described in Chemical Formula 2A-1 and 2B-1, and $R''$ and $R^o$ are the same as described with respect to $R^q$ and $R^r$ in Chemical Formula 2A and 2B.

For example, one of the auxiliary layers 40 and 50 may be an inorganic auxiliary layer, and the other of the auxiliary layers 40 and 50 may be an organic auxiliary layer.

For example, one of the auxiliary layers 40 and 50 may be omitted.

The aforementioned photoelectric conversion device 100 may be applied to, for example, a sensor, and the sensor may be, for example, an image sensor. The image sensor to which the aforementioned photoelectric conversion device 100 is applied may be suitable for high speed photographing by reducing an after-image due to remaining charge carriers.

Hereinafter, an example of an image sensor to which the aforementioned device is applied is described with reference to the drawings. An organic CMOS image sensor is described as an example of the image sensor.

Figure 3:
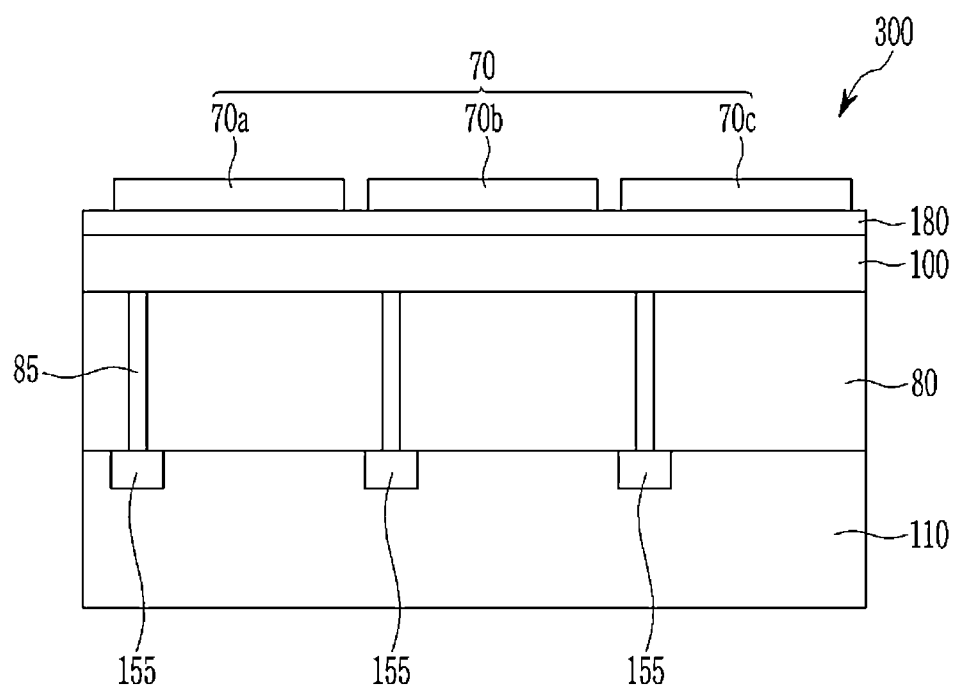
FIG. 3 is a cross-sectional view showing an example of an image sensor according to example embodiments.

FIG. 3 is a cross-sectional view showing an example of an image sensor according to example embodiments.

Referring to FIG. 3, an image sensor 300 according to example embodiments includes a semiconductor substrate 110, an insulating layer 80, a photoelectric conversion device 100, and a color filter layer 70.

The semiconductor substrate 110 may be a silicon substrate, and is integrated with the transmission transistor (not shown) and the charge storage 155. The transmission transistor and/or the charge storage 155 may be integrated in each pixel. The charge storage 155 is electrically connected to the photoelectric conversion device 100.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto.

The insulation layer 80 is formed on the metal line and pad. The insulation layer 80 may be made of an inorganic insulating material such as a silicon oxide and/or a silicon nitride, or a low dielectric constant (low K) material such as SiC, SiCOH, SiCO, and SiOF. The insulation layer 80 has a trench 85 exposing the charge storage 155. The trench 85 may be filled with fillers.

The aforementioned photoelectric conversion device 100 is formed on the insulation layer 80. The photoelectric conversion device 100 may have the structure shown in FIG. 1 or 2, and the detailed description thereof is the same as described above. One of the first electrode 10 and the second electrode 20 of the photoelectric conversion device 100 may be a light-receiving electrode, and the other of the first electrode 10 and the second electrode 20 of the photoelectric conversion device 100 may be connected to the charge storage 155.

The color filter layer 70 is formed on the photoelectric conversion device 100. The color filter layer 70 includes a blue filter 70a formed in a blue pixel, a red filter 70b formed in a red pixel, and a green filter 70c formed in a green pixel. However, the color filter layer 70 may include a cyan filter, a magenta filter, and/or a yellow filter, instead of the above filters, or may further include them in addition to the above filters.

An insulating layer 180 is formed between the photoelectric conversion device 100 and the color filter layer 70. The insulation layer 180 may be omitted.

Focusing lens (not shown) may be further formed on the color filter layer 70. The focusing lens may control a direction of incident light and gather the light in one region. The focusing lens may have a shape of, for example, a cylinder or a hemisphere, but is not limited thereto.

Figure 4:
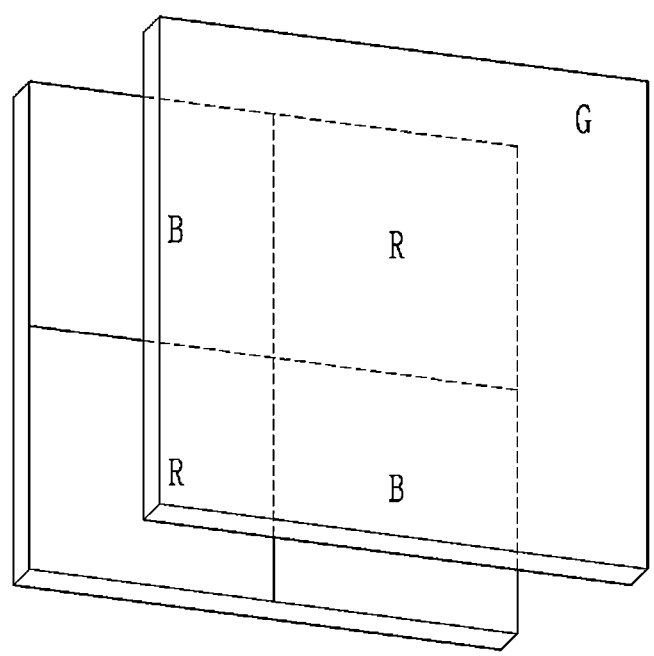
FIG. 4 is a plan view showing an example of an image sensor according to example embodiments.
Figure 5:
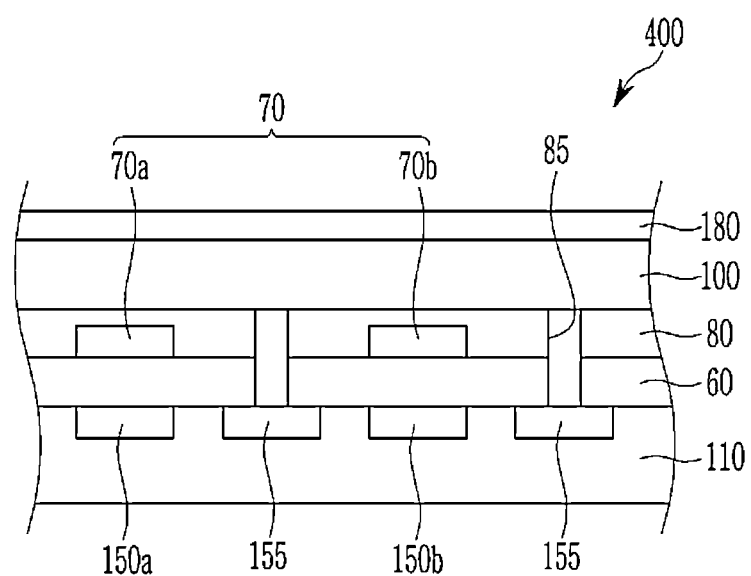
FIG. 5 is a cross-sectional view showing an example of the image sensor of FIG. 4.

FIG. 4 is a plan view showing an example of an image sensor according to example embodiments and FIG. 5 is a cross-sectional view showing an example of the image sensor of FIG. 4.

Referring to FIGS. 4 and 5, an image sensor 400 according to example embodiments includes a semiconductor substrate 110 integrated with photo-sensing devices 150a and 150b, a transmission transistor (not shown), and a charge storage 155, a lower insulation layer 60, a color filter layer 70, an upper insulation layer 80, and the aforementioned photoelectric conversion device 100.

The semiconductor substrate 110 may be a silicon substrate, and is integrated with the photo-sensing devices 150a and 150b, the transmission transistor (not shown), and the charge storage 155. The photo-sensing devices 150a and 150b may be photodiodes.

The photo-sensing devices 150a and 150b, the transmission transistor, and/or the charge storage 155 may be integrated in each pixel, and as shown in the drawing, the photo-sensing devices 150a and 150b may be respectively included in a blue pixel and a red pixel and the charge storage 155 may be included in a green pixel.

The photo-sensing devices 150a and 150b sense light. The information sensed by the photo-sensing devices may be transferred by the transmission transistor. The charge storage 155 is electrically connected to the photoelectric conversion device 100 that will be described later, and the information of the charge storage 155 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. However, it is not limited to the structure, and the metal wire and pad may be disposed under the photo-sensing devices 150a and 150b.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench 85 exposing the charge storage 155. The trench 85 may be filled with fillers.

A color filter layer 70 is formed on the lower insulation layer 60. The color filter layer 70 includes a blue filter 70a formed in a blue pixel and a red filter 70b in a red pixel. However, the present disclosure is not limited thereto and may include a cyan filter, a magenta filter and/or a yellow filter instead or additionally. In the present embodiment, a green filter is not included, but a green filter may be further included.

The upper insulation layer 80 is formed on the color filter layer 70. The upper insulation layer 80 eliminates a step caused by the color filter layer 70 and smoothens the surface. The upper insulation layer 80 and the lower insulation layer 60 may include a contact hole (not shown) exposing a pad, and a trench 85 exposing a charge storage 155 of a green pixel.

The aforementioned photoelectric conversion device 100 is formed on the upper insulating layer 80. The photoelectric conversion device 100 may have the structure shown in FIG.

1 or 2, and the detailed description thereof is the same as described above. One of the first electrode 10 and the second electrode 20 of the photoelectric conversion device 100 may be a light-receiving electrode, and the other of the first electrode 10 and the second electrode 20 of the photoelectric conversion device 100 may be connected to the charge storage 155. An insulating layer 180 is formed on the photoelectric conversion device 100. The insulation layer 180 may be omitted.

Focusing lens (not shown) may be further formed on the photoelectric conversion device 100. The focusing lens may control a direction of incident light and gather the light in one region. The focusing lens may have a shape of, for example, a cylinder or a hemisphere, but is not limited thereto.

Figure 6:
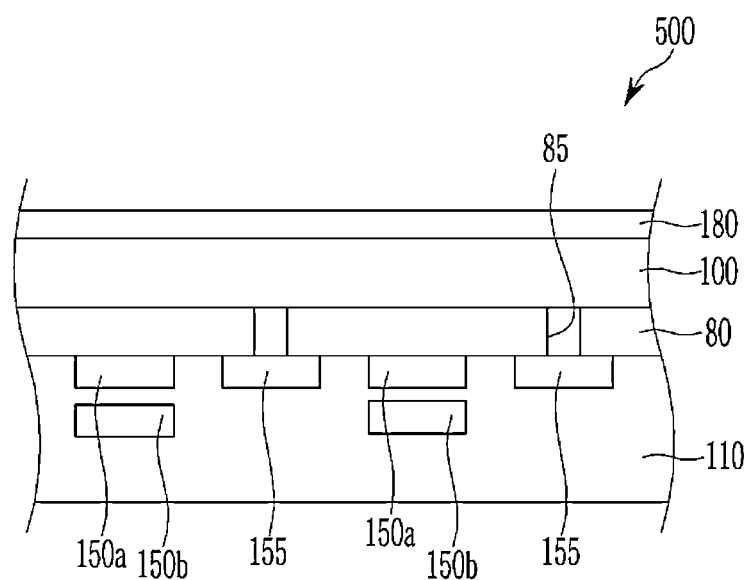
FIG. 6 is a cross-sectional view showing another example of the image sensor of FIG. 4.

FIG. 6 is a cross-sectional view showing another example of the image sensor of FIG. 4.

Referring to FIG. 6, an image sensor 500 according to the present embodiment includes a semiconductor substrate 110 integrated with photo-sensing devices 150a and 150b, a transmission transistor (not shown), and a charge storage 155, an upper insulation layer 80, and a photoelectric conversion device 100.

However, in the image sensor 500 according to the present embodiment, unlike the aforementioned embodiment, the photo-sensing devices 150a and 150b are stacked in the vertical direction and the lower insulation layer 60 and the color filter layer 70 are omitted. The photo-sensing devices 150a and 150b are electrically connected to a charge storage (not shown) and may be transferred by a transfer transistor. The photo-sensing devices 150a and 150b may be configured to selectively absorb light in each wavelength region according to the stacking depth.

The photoelectric conversion device 100 may have the structure shown in FIG. 1 or 2, and the detailed description thereof is the same as described above. One of the first electrode 10 and the second electrode 20 of the photoelectric conversion device 100 may be a light-receiving electrode, and the other of the first electrode 10 and the second electrode 20 of the photoelectric conversion device 100 may be connected to the charge storage 155. An insulating layer 180 is formed on the photoelectric conversion device 100. The insulation layer 180 may be omitted.

Figure 7:
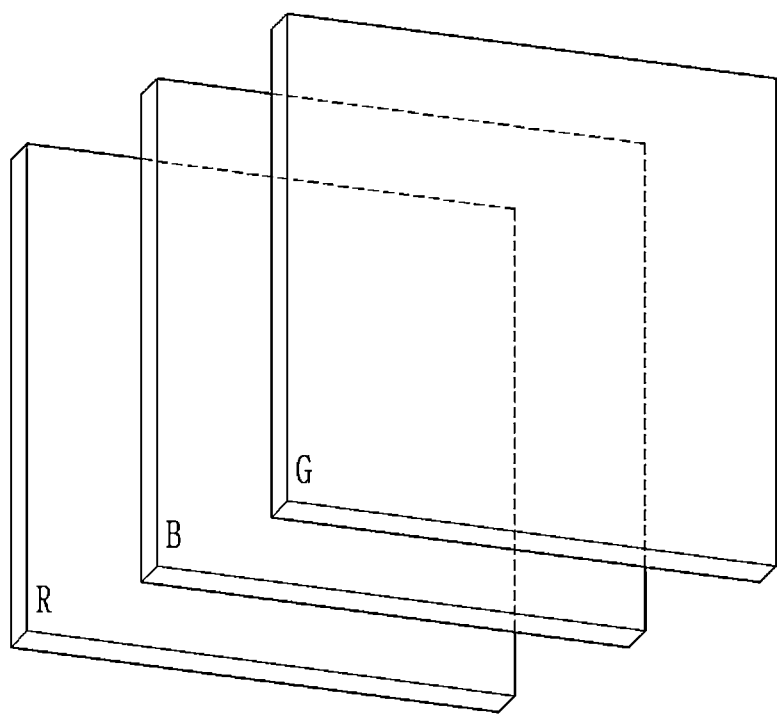
FIG. 7 is a plan view showing another example of an image sensor according to example embodiments.
Figure 8:
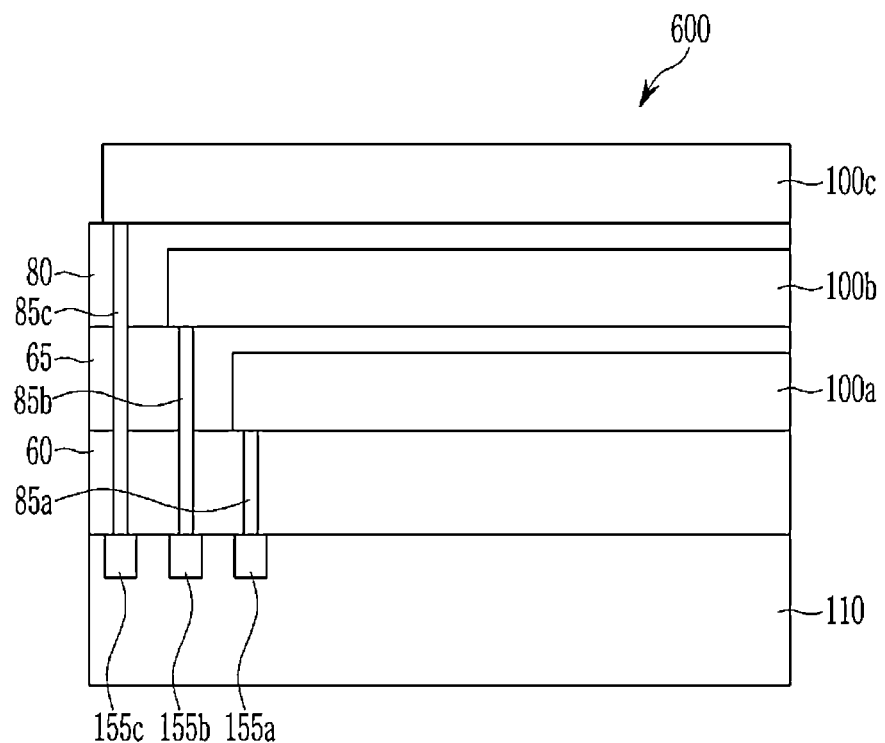
FIG. 8 is a cross-sectional view showing an example of the image sensor of FIG. 7.

FIG. 7 is a plan view showing another example of an image sensor according to example embodiments, and FIG. 8 is a cross-sectional view showing an example of the image sensor of FIG. 7.

An image sensor 600 according to the present embodiment has a structure in which a green photoelectric device configured to selectively absorb light in a green wavelength region, a blue photoelectric device configured to selectively absorb light in a blue wavelength region, and a red photoelectric device configured to selectively absorb light in a red wavelength region are stacked.

The image sensor 600 according to the present embodiment includes a semiconductor substrate 110, a lower insulation layer 60, an intermediate insulation layer 65, an upper insulation layer 80, a first photoelectric conversion device 100a, a second photoelectric conversion device 100b, and a third photoelectric conversion device 100c.

The semiconductor substrate 110 may be a silicon substrate, and is integrated with the transmission transistor (not shown) and the charge storages 155a, 155b, and 155c.

A metal wire (not shown) and a pad (not shown) are formed on the semiconductor substrate 110, and the lower insulation layer 60 is formed on the metal wire and the pad.

The first photoelectric conversion device 100a, the second photoelectric conversion device 100b, and the third photoelectric conversion device 100c are sequentially formed on the lower insulation layer 60.

The first, second, and third photoelectric conversion devices 100a, 100b, and 100c may each independently have the structure shown in FIG. 1 or 2, and the detailed descriptions thereof are the same as described above. One of the first electrode 10 and the second electrode 20 of the first, second and third photoelectric conversion devices 100a, 100b, and 100c may be a light-receiving electrode, and the other of the first electrode 10 and the second electrode 20 of the first, second and third photoelectric conversion devices 100a, 100b, and 100c may be connected to the charge storages 155a, 155b, and 155c.

The first photoelectric conversion device 100a may be configured to selectively absorb light in one of red, blue, and green wavelength regions and may be configured to photoelectrically convert the absorbed light. For example, the first photoelectric conversion device 100a may be a red photoelectric conversion device. The intermediate insulation layer 65 is formed on the first photoelectric conversion device 100a.

A second photoelectric conversion device 100b is formed on the intermediate insulation layer 65.

The second photoelectric conversion device 100b may be configured to selectively absorb light in one of red, blue, and green wavelength regions and may be configured to photoelectrically convert the absorbed light. For example, the second photoelectric conversion device 100b may be a blue photoelectric conversion device.

The upper insulation layer 80 is formed on the second photoelectric conversion device 100b. The lower insulation layer 60, the intermediate insulation layer 65, and the upper insulation layer 80 have a plurality of trenches 85a, 85b, and 85c exposing charge storages 155a, 155b, and 155c.

The third photoelectric conversion device 100c is formed on the upper insulation layer 80. The third photoelectric conversion device 100c may be configured to selectively absorb light in one of red, blue, and green wavelength regions and may photoelectrically convert the absorbed light. For example, the third photoelectric conversion device 100c may be a green photoelectric conversion device.

Focusing lens (not shown) may be further formed on the third photoelectric conversion device 100c. The focusing lens may control a direction of incident light and gather the light in one region. The focusing lens may have a shape of, for example, a cylinder or a hemisphere, but is not limited thereto.

In the drawing, the first photoelectric conversion device 100a, the second photoelectric conversion device 100b, and the third photoelectric conversion device 100c are sequentially stacked, but the present disclosure is not limited thereto, and they may be stacked in various orders.

As described above, the first photoelectric conversion device 100a, the second photoelectric conversion device 100b, and the third photoelectric conversion device 100c are stacked, and thus the size of an image sensor may be reduced to realize a down-sized image sensor.

Figure 9:
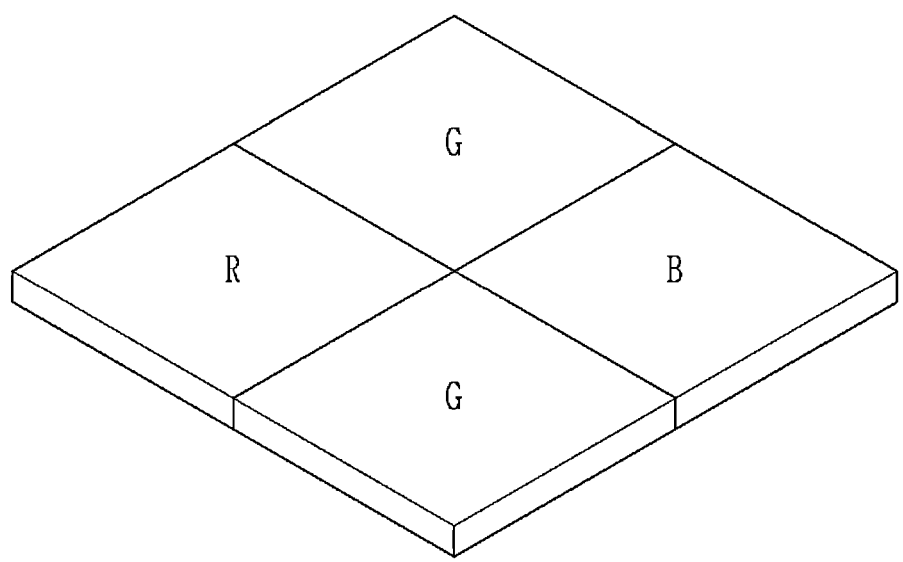
FIG. 9 is a plan view showing another example of an image sensor according to example embodiments.
Figure 10:
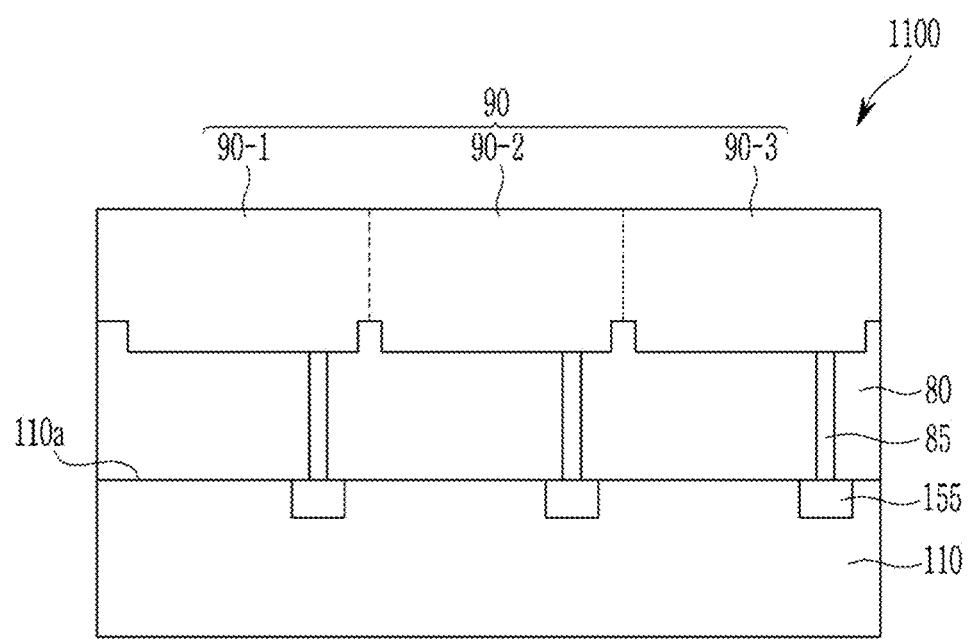
FIG. 10 is a cross-sectional view showing an example of the image sensor of FIG. 9.

FIG. 9 is a plan view showing another example of an image sensor according to example embodiments and FIG. 10 is a cross-sectional view showing an example of the image sensor of FIG. 9.

Referring to FIGS. 9 and 10, an image sensor 1100 includes a photoelectric conversion device 90 disposed on a semiconductor substrate 110, and the photoelectric conversion device 90 includes a plurality of photoelectric conversion devices 90-1, 90-2, and 90-3. The plurality of the photoelectric conversion devices 90-1, 90-2, and 90-3 may convert light (e.g., blue light, green light, or red light) in different wavelength regions into an electrical signal. Referring to FIG. 10, a plurality of the photoelectric conversion devices 90-1, 90-2, and 90-3 may be arranged on the semiconductor substrate 110 in a horizontal direction such that the photoelectric conversion devices 90-1, 90-2, and 90-3 may be partially or entirely overlapped with each other in a direction extending in parallel with the surface 110$a$ of the semiconductor substrate 110. Each photoelectric conversion device 90-1, 90-2, and 90-3 is connected to a charge storage 155 integrated in the semiconductor substrate 110 through a trench 85.

Each photoelectric conversion device 90-1, 90-2, 90-3 may be one of the aforementioned photoelectric conversion devices 100 and 200. For example, two or more of photoelectric conversion devices 90-1, 90-2, and 90-3 may include different portions of a common, continuous layer that extends continuously between the photoelectric conversion devices 90-1, 90-2, and 90-3. For example, the plurality of photoelectric conversion devices 90-1, 90-2, and 90-3 may share a common first electrode 10 and/or a common second electrode 20. For example, two or more of the photoelectric conversion devices 90-1, 90-2, and 90-3 may have different photoelectric conversion layer 30 configured to absorb different wavelength regions of incident light. Other configurations of the image sensor 1100 may be the same as one or more of the image sensors described with reference to FIGS. 3 to 8.

Figure 11:
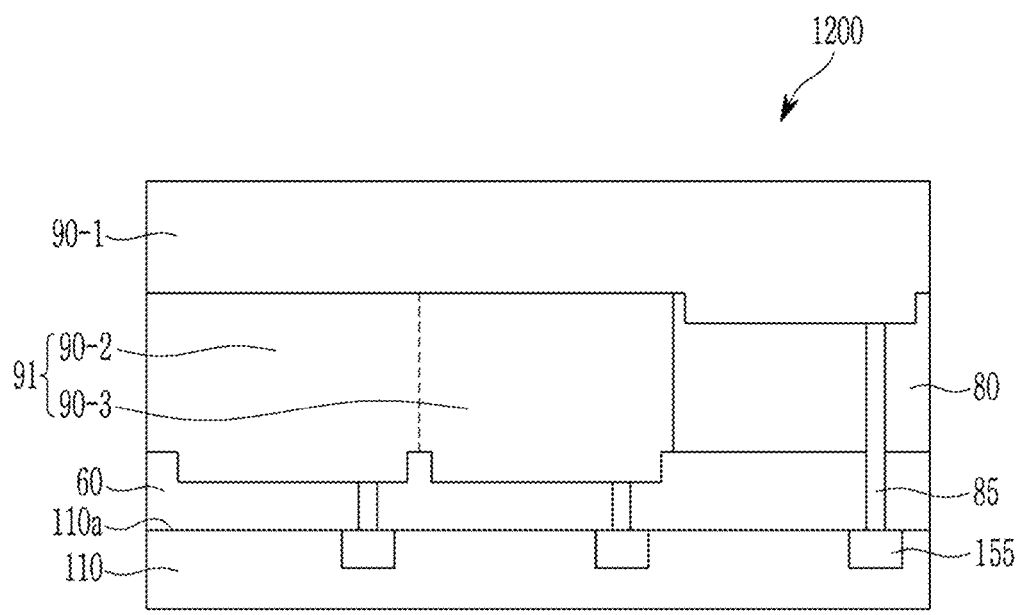
FIG. 11 is a cross-sectional view showing an example of an image sensor according to example embodiments.

FIG. 11 is a cross-sectional view showing an example of an image sensor according to example embodiments.

Referring to FIG. 11, an image sensor 1200 includes a semiconductor substrate 110 and photoelectric conversion devices 90-1 and 91 which are stacked on the semiconductor substrate 110. The photoelectric conversion device 91 includes a plurality of photoelectric conversion devices 90-2 and 90-3 and the plurality of photoelectric conversion devices 90-2 and 90-3 may be arranged to be overlapped with each other in a direction extending in parallel with the surface 110$a$ of the semiconductor substrate 110. The plurality of the photoelectric conversion devices 90-1, 90-2, and 90-3 may convert light (e.g., blue light, green light, or red light) in different wavelength regions into an electrical signal.

As an example, the photoelectric conversion device 90-1 may include horizontally-arranged, plurality of photoelectric conversion devices configured to absorb light in different wavelength regions. As an example, the photoelectric conversion device 91 may photoelectrically convert light of one wavelength region selected from blue light, green light, and red light. As an example, the photoelectric conversion device 91 may be partially or entirely overlapped with the photoelectric conversion device 90-1. Other configurations of the image sensor 1200 may be the same as one or more of the image sensors described with reference to FIGS. 3 to 8.

Figure 12:
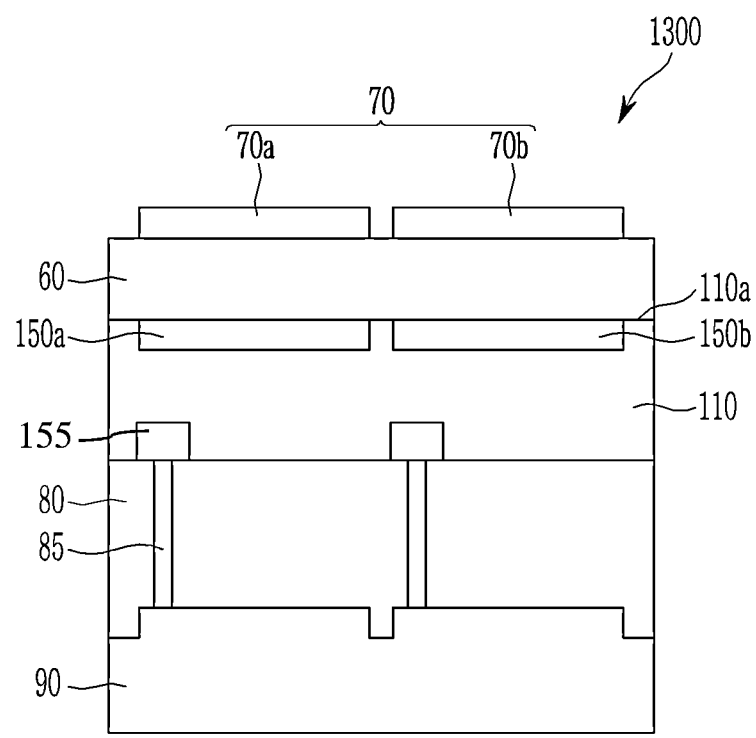
FIG. 12 is a cross-sectional view showing another example of an image sensor according to example embodiments.

FIG. 12 is a cross-sectional view showing another example of an image sensor according to example embodiments.

Referring to FIG. 12, an image sensor 1300 includes a semiconductor substrate 110 integrated with photo-sensing devices 150$a$ and 150$b$, a transmission transistor (not shown), and a charge storage 155; an upper insulation layer 80 and a color filter layer 70 which are disposed on the semiconductor substrate 110; a lower insulation layer 60 and a photoelectric conversion device 90 which are disposed under the semiconductor substrate 110. The photoelectric conversion device 90 may be the aforementioned photoelectric conversion devices 100 and 200. As shown in FIG. 12, the photoelectric conversion device 90 is disposed under the semiconductor substrate 110 and thereby the photoelectric conversion device 90 and the color filter layer 70 are separated with respect to the photo-sensing devices 150$a$ and 150$b$. Other configurations of the image sensor 1300 may be the same as one or more of the image sensors described with reference to FIGS. 3 to 8.

Figure 17:
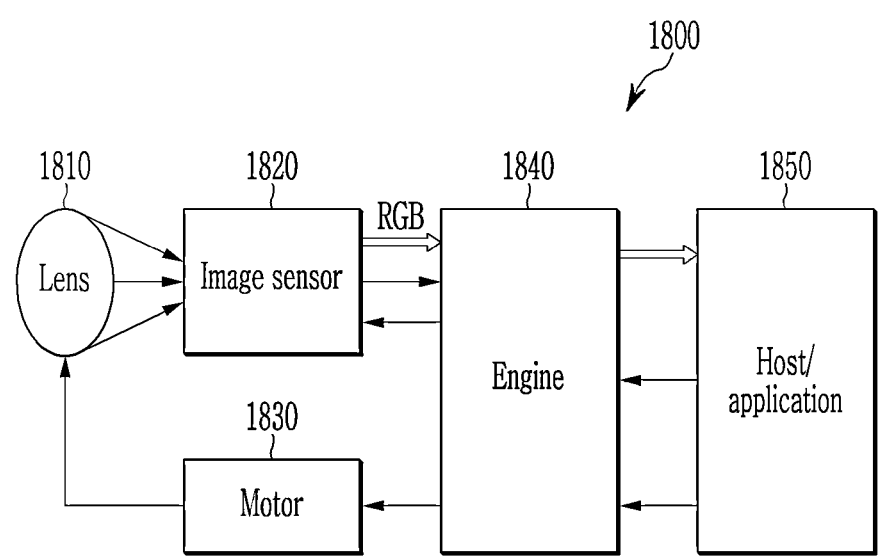
FIG. 17 is a block diagram of a digital camera including an image sensor according to an embodiment.

The aforementioned photoelectric conversion device and sensor may be applied to various electronic devices, for example a mobile phone, a camera (as depicted in FIG. 17), a biometric device, and/or automotive electronic parts, but is not limited thereto.

Figure 13:
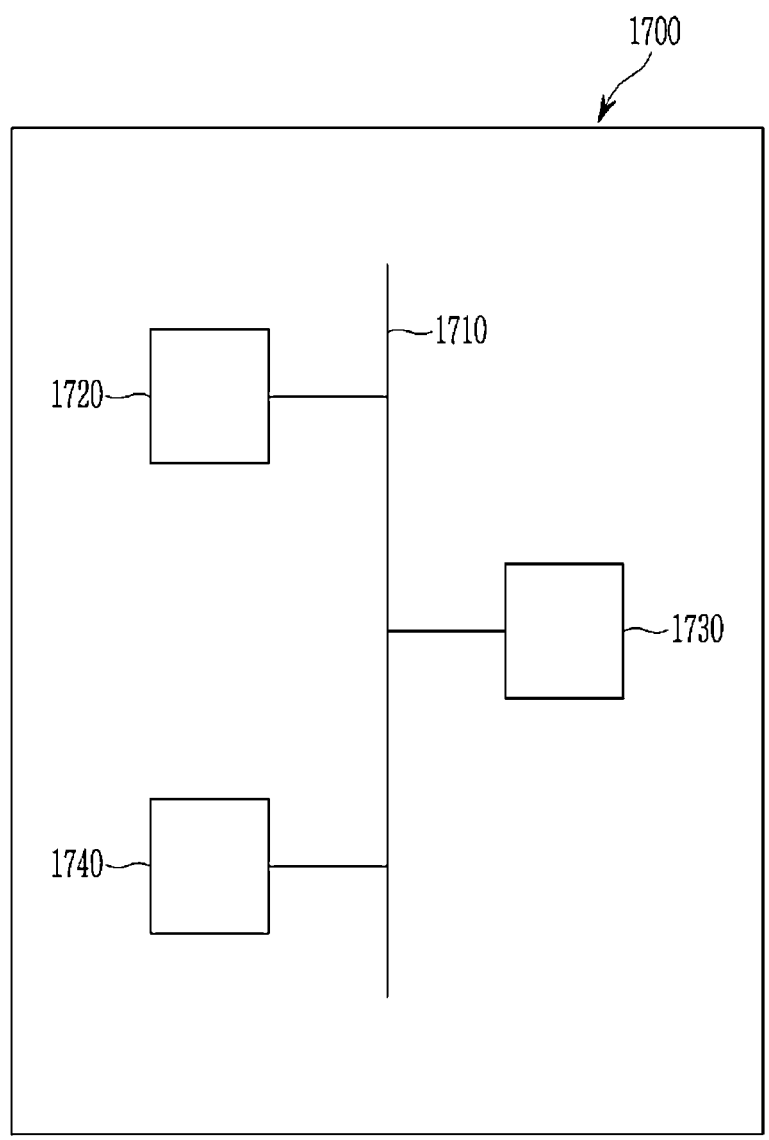
FIG. 13 is a schematic diagram showing an electronic device according to example embodiments.

FIG. 13 is a schematic diagram showing an electronic device according to example embodiments.

Referring to FIG. 13, an electronic device 1700 may include a processor 1720, a memory 1730, and an image sensor 1740 that are electrically coupled together via a bus 1710. The image sensor 1740 may be one according to one of the aforementioned embodiments. The memory 1730, which may be a non-transitory computer readable medium, may store a program of instructions. The memory 1730 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The processor 1720 may execute the stored program of instructions to perform one or more functions. For example, the processor 1720 may be configured to process electrical signals generated by the image sensor 1740. The processor 1720 may be configured to generate an output (e.g., an image to be displayed on a display interface) based on such as processing.

FIG. 17 is a block diagram of a digital camera including an image sensor according to an embodiment.

Referring to FIG. 17, a digital camera 1800 includes a lens 1810, an image sensor 1820, a motor 1830, and an engine 1840. The image sensor 1820 may be one according to one of the aforementioned embodiments.

The lens 1810 concentrates incident light on the image sensor 1820. The image sensor 1820 generates RGB data for received light through the lens 1810. In some embodiments, the image sensor 1820 may interface with the engine 1840.

The motor 1830 may adjust the focus of the lens 1810 or perform shuttering in response to a control signal received from the engine 1840. The engine 1840 may control the image sensor 1820 and the motor 1830. The engine 1840 may be connected to a host/application 1050.

In example embodiments, processor 1720 of FIG. 13, the motor 1830, engine 1840, and host/application 1050 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Hereinafter, the embodiments are illustrated in more detail with reference to examples. However, these examples are non-limiting examples, and inventive concepts are not limited thereto.

Simulation Evaluation

(1) EXAMPLES AND COMPARATIVE EXAMPLES

A simulation evaluation is performed by assuming Compound B as a first material; fullerene $C_{60}$ as a second material; and one of Compounds C-1 to C-5 as a third material, molecular-dynamically predicting atomistic morphology based on molecular structures of the first, second, and third materials in each thin film including the first, second, and third materials according to Table 1, and performing a quantum calculation with respect to all the molecules included in the morphology to obtain an energy level distribution. Herein, the first material and the second material are included in a volume ratio of 1:1, and the third material is included in 5 volume % based on a total volume of the first and third materials.

The quantum calculation is performed by considering conformation and a surrounding environment of each molecule of the morphology. Accordingly, the energy level distribution may be evaluated by considering a conformation change of the first material depending on influences of the third material or a surrounding environment change of the molecules.

TABLE 1

|  | First material | Second material | Third material |
|---|---|---|---|
| Example 1 | compound B | C60 | Compound C-1 |
| Example 2 |  |  | Compound C-2 |
| Example 3 |  |  | Compound C-3 |
| Comparative Example 1 |  |  | — |
| Comparative Example 2 |  |  | Compound C-4 |
| Comparative Example 3 |  |  | Compound C-5 |

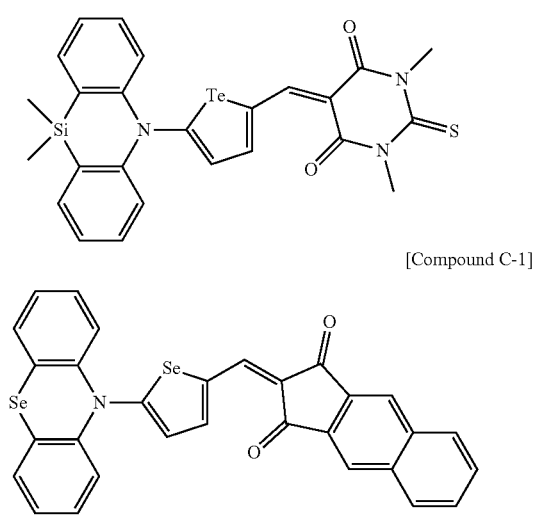

[Compound B]

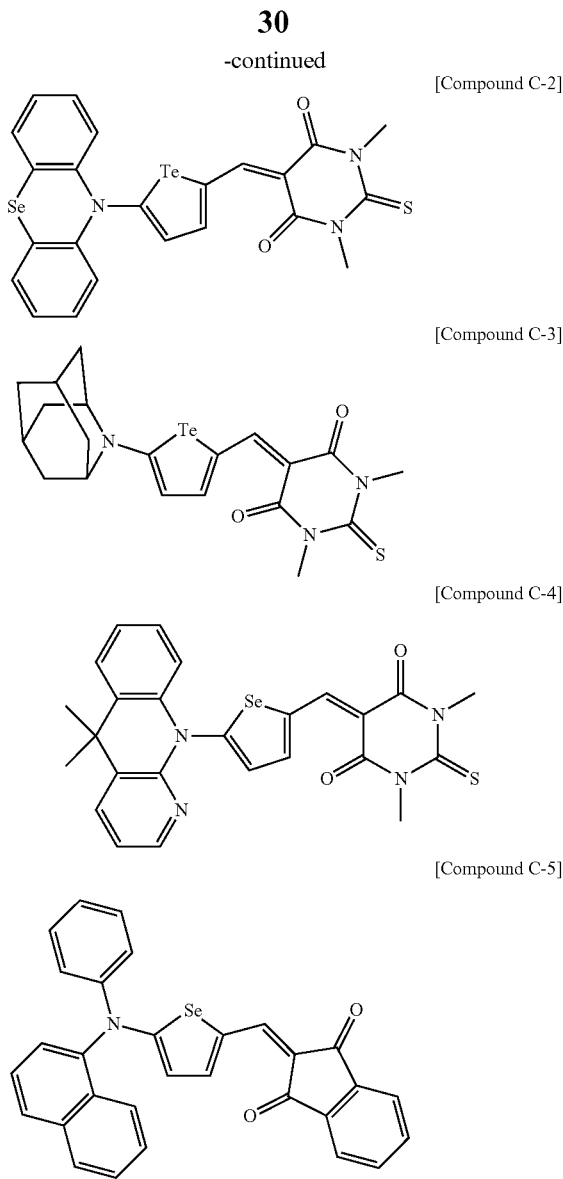

[Compound C-1]

[Compound C-2]

[Compound C-3]

[Compound C-4]

[Compound C-5]

(2) EVALUATION OF PROPERTIES OF MATERIALS

Properties of the first material, the second material, and the third material are shown in Table 2.

A simulation calculation of HOMO energy level distribution is performed by using a Quantum patch software (Nanomatch GmbH), and a simulation calculation of dipole moments of molecules is performed by using a Jaguar software (Schrodinger, LLC. Materials science suite). However, the Quantum patch software of B3LYP/def2-SVP and the Jaguar software of LACV3P" basis set performs a Density Functional Theory (DFT) calculation.

TABLE 2

|  |  | Dipole moment (Debye) | HOMO (eV) | LUMO (eV) |
|---|---|---|---|---|
| First material |  | — | 5.49 | 2.56 |
| Second material |  | — | 6.40 | 3.65 |
| Third | C-1 | 5.6959 | 5.46 | 2.54 |

TABLE 2-continued

|  |  | Dipole moment (Debye) | HOMO (eV) | LUMO (eV) |
|---|---|---|---|---|
| material | C-2 | 11.2334 | 5.69 | 2.67 |
|  | C-3 | 12.3277 | 5.35 | 2.36 |
|  | C-4 | 4.4203 | 5.74 | 3.31 |
|  | C-5 | 5.3174 | 5.39 | 2.46 |

(3) SIMULATION RESULT I

A remaining charge carrier change depending on changes in the distribution of a HOMO energy level of the first material is evaluated through a simulation.

Figure 14:
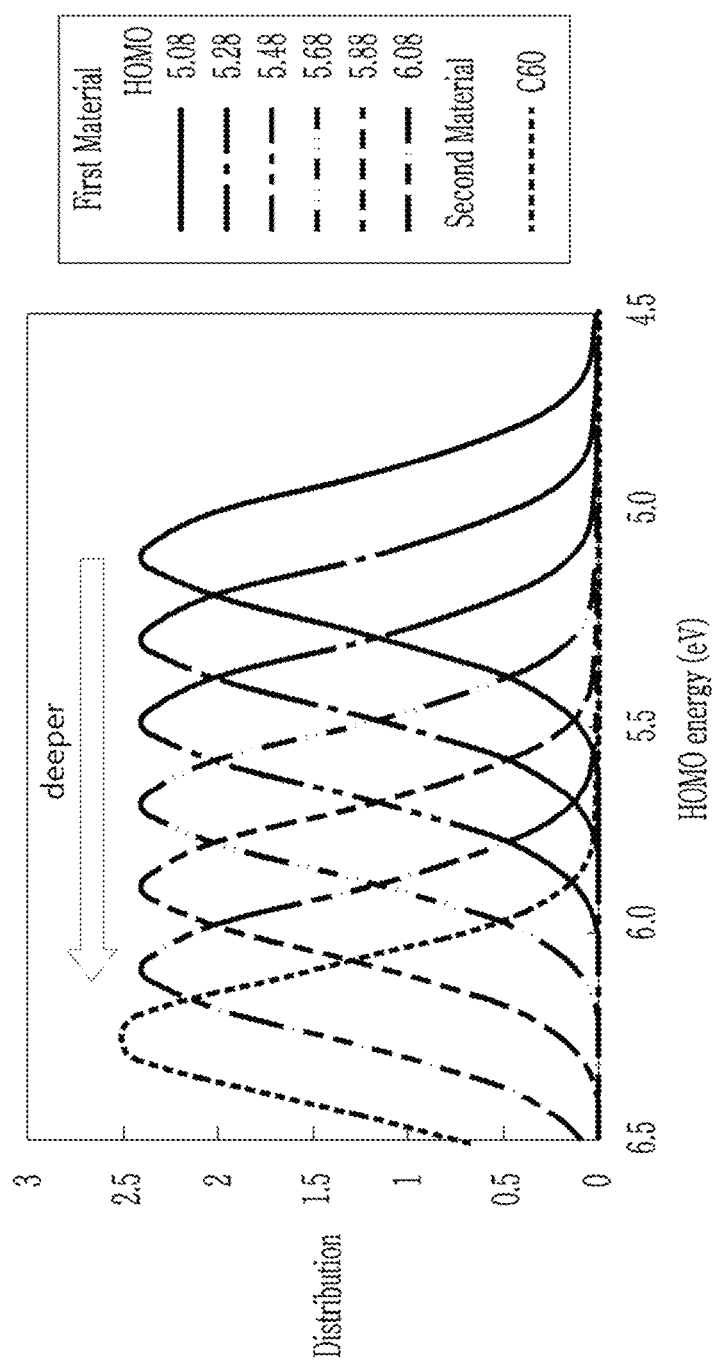
FIG. 14 is a graph showing changes in distributions of HOMO energy levels of the first material.
Figure 15:
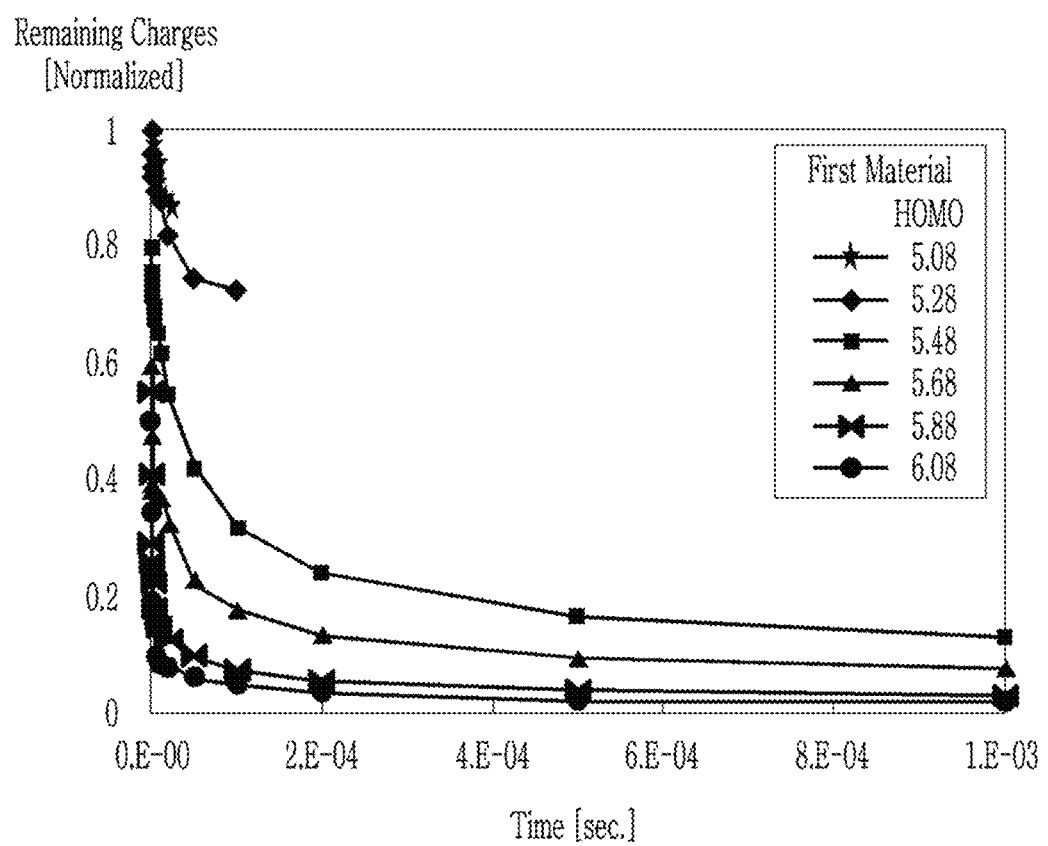
FIGS. 15 and 16 are graphs showing changes in remaining charge carriers depending on changes in the distribution of HOMO energy levels of the first material.
Figure 16:
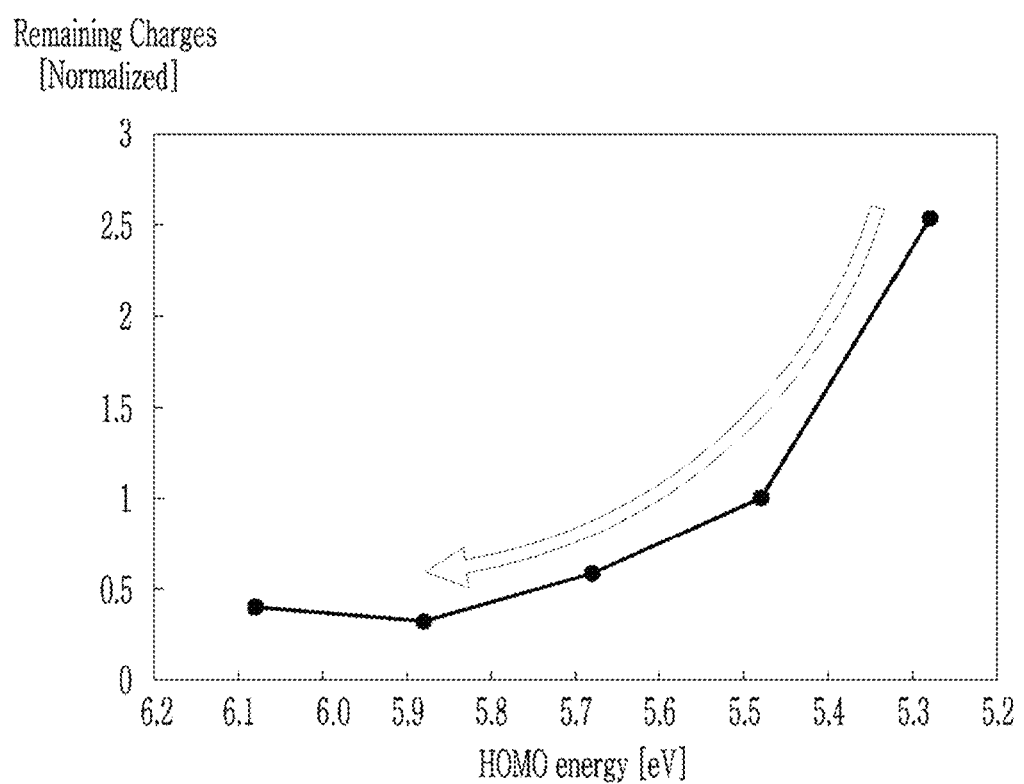

FIG. 14 is a graph showing changes in distributions of HOMO energy levels of the first material, and FIGS. 15 and 16 are graphs showing changes in remaining charge carriers depending on changes in the distribution of HOMO energy levels of the first material.

Referring to FIGS. 15 and 16, as the HOMO energy level distribution of the first material is shifted toward a deeper direction, remaining charge carrier characteristics may be improved.

(4) SIMULATION RESULT II

Energy level changes of the first material and remaining charge carrier changes depending on the energy level changes are evaluated.

The results are shown in Table 3.

TABLE 3

|  | Original HOMO (eV) of first material | Shifted HOMO (eV) of first material | ΔHOMO (eV) | Remaining charge carriers (h + /s/μm²) |
|---|---|---|---|---|
| Example 1 | 5.490 | 5.495 | 0.005 | 114 |
| Example 2 |  | 5.502 | 0.012 | 108 |
| Example 3 |  | 5.508 | 0.018 | 67 |
| Comparative Example 1 |  | 5.490 (the same) | 0 | 124 |
| Comparative Example 2 |  | 5.479 | −0.011 | 154 |
| Comparative Example 3 |  | 5.482 | −0.008 | 134 |

Referring to Table 3, as HOMO energy level of the first material becomes deeper, remaining charge carriers characteristics may be improved, and as the HOMO energy level change of the first material is larger, the remaining charge carrier characteristics may be further improved.

Device Evaluation (1) Manufacture of Devices

Photoelectric conversion devices are manufactured to experimentally verify the simulation evaluations.

Device Example 1

An ITO is sputtered on a glass substrate to form a 150 nm-thick anode. On the anode, Compound A is deposited to form a 5 nm-thick charge blocking layer. On the charge blocking layer, Compound B (the first material) ($\lambda_{max}$: 545 nm), fullerene ($C_{60}$, the second material), and Compound C-1 (the third material) ($\lambda_{max}$: 551 nm) are co-deposited to form a 100 nm-thick photoelectric conversion layer. Herein, the first material and the second material are co-deposited in a volume ratio (a thickness ratio) of 1:1, and the third material is co-deposited in an amount of 5 volume % based on the total volume of the first and third materials. The modified HOMO energy level of the first material in the photoelectric conversion layer is 5.495 eV and LUMO energy level of fullerene is 3.563 eV. On the photoelectric conversion layer, Yb is thermally deposited to form a 1.5 nm-thick electron buffer layer (work function: 2.6 eV). On the electron buffer layer, ITO is sputtered to form a 7 nm-thick cathode. Subsequently, on the cathode, aluminum oxide ($Al_2O_3$) is deposited to form a 50 nm-thick anti-reflection layer and then, sealed with a glass plate and thus manufacture a photoelectric conversion device.

[Compound A]

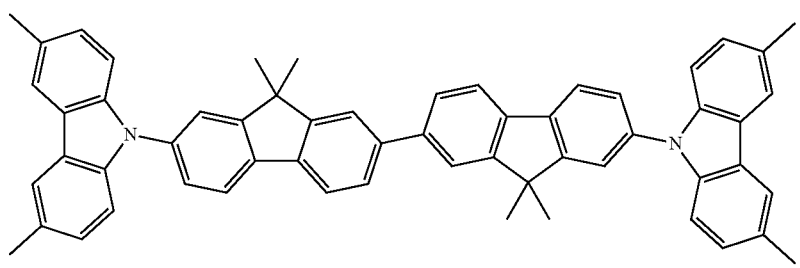

Device Example 2

A photoelectric conversion device is manufactured according to the same method as Device Example 1 except that the photoelectric conversion layer is formed by using Compound C-2 ($\lambda_{max}$: 538 nm) instead of Compound C-1 as the third material. The modified HOMO energy level of the first material in the photoelectric conversion layer is 5.502 eV.

Device Example 3

A photoelectric conversion device is manufactured according to the same method as Device Example 1 except that a photoelectric conversion layer is formed by using Compound C-3 ($\lambda_{max}$: 538 nm) instead of Compound C-1 as the third material. The modified HOMO energy level of the first material in the photoelectric conversion layer is 5.508 eV.

Device Comparative Example 1

A photoelectric conversion device is manufactured according to the same method as Device Example 1 except that a photoelectric conversion layer is formed by co-depositing the first and second materials without the third material. The HOMO energy level of the first material in the photoelectric conversion layer is 5.490 eV.

Device Comparative Example 2

A photoelectric conversion device is manufactured according to the same method as Device Example 1 except that a photoelectric conversion layer is formed by using Compound C-4 ($\lambda_{max}$: 534 nm) instead of Compound C-1 as the third material. The modified HOMO energy level of the first material in the photoelectric conversion layer is 5.479 eV.

Device Comparative Example 3

A photoelectric conversion device is manufactured according to the same method as Device Example 1 except that a photoelectric conversion layer is formed by using Compound C-5 instead of Compound C-1 as the third material. The modified HOMO energy level of the first material in the photoelectric conversion layer is 5.482 eV.

(2) Evaluation

Remaining charge carrier characteristics of the photoelectric conversion devices according to Device Examples and Device Comparative Examples are evaluated.

The remaining charge carrier characteristics are evaluated by measuring an amount of charge carriers not used in a signal treatment but still read in the next frame out of the photoelectrically converted charge carriers in one frame and specifically, by irradiating the devices of Examples and Comparative Examples with photoelectrically convertible light of a green wavelength region for 33 milliseconds and then, measuring a current amount by a unit of $10^{-6}$ second with a Keithley 2400 equipment. An amount of the remaining electrons is evaluated at 5000 lux by a h+/s/µm² unit.

The results are shown in Table 4.

TABLE 4

|  | Remaining electron (h + /s/µm²) |
|---|---|
| Device Example 1 | 114 |
| Device Example 2 | 108 |
| Device Example 3 | 67 |
| Device Comparative Example 1 | 124 |
| Device Comparative Example 2 | 154 |
| Device Comparative Example 3 | 134 |

Referring to Table 4, the devices of Device Examples exhibit improved remaining electron characteristics compared with those of Device Comparative Examples. In addition, Device Examples exhibit substantially equivalent results to the simulation results.

While some example embodiments have been described, it is to be understood that inventive concepts are not limited to the disclosed embodiments, but, on the contrary, are intended to cover various modifications and equivalent arrangements included within the spirit and scope of the appended claims.

What is claimed is:

1. A photoelectric conversion device, comprising
a first electrode and a second electrode; and
a photoelectric conversion layer between the first electrode and the second electrode, wherein
the photoelectric conversion layer includes a mixture of a first material, a second material, and a third material, the first material, the second material, and the third material being different from each other,
the first material is represented by Chemical Formula A-1,

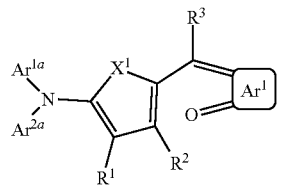

wherein, in Chemical Formula A-1,
$X^1$ is O, S, Se, Te, SO, SO$_2$, SiR$^a$R$^b$, or GeR$^c$R$^d$,
Ar$^1$ is a substituted or unsubstituted C6 to C30 arylene group, a substituted or unsubstituted C3 to C30 heterocyclic group, or a fused ring including a combination thereof,
Ar$^{1a}$ and Ar$^{2a}$ independently are hydrogen, deuterium, a substituted or unsubstituted C1 to C30 alkyl group, a substituted or unsubstituted C3 to C30 cycloalkyl group, a substituted or unsubstituted C6 to C30 aryl group, or a substituted or unsubstituted C3 to C30 heteroaryl group,
Ar$^{1a}$ and Ar$^{2a}$ are independently present alone or are linked with each other to form a fused ring, and
R$^1$ to R$^3$ and R$^a$ to R$^d$ independently are hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, or a cyano group, and
the third material is represented by Chemical Formula 1-1

[Chemical Formula 1-1]

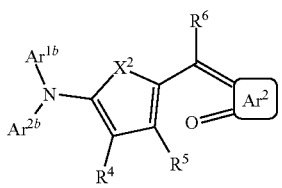

wherein, in Chemical Formula 1-1,
$X^2$ is O, S, Se, Te, SO, SO$_2$, SiR$^a$R$^b$, or GeR$^c$R$^d$,
Ar$^2$ is a substituted or unsubstituted C6 to C30 arylene group, a substituted or unsubstituted C3 to C30 heterocyclic group, or a fused ring including a combination thereof,
Ar$^{1b}$ and Ar$^{2b}$ independently are hydrogen, deuterium, a substituted or unsubstituted C1 to C30 alkyl group, a substituted or unsubstituted C3 to C30 cycloalkyl group, a substituted or unsubstituted C6 to C30 aryl group, or a substituted or unsubstituted C3 to C30 heteroaryl group,
Ar$^{1b}$ and Ar$^{2b}$ are independently present alone or are linked with each other to form a fused ring, and
R$^4$ to R$^6$ and R$^a$ to R$^d$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, or a cyano group.

2. The photoelectric conversion device of claim 1, wherein
an absorption spectrum of the photoelectric conversion layer has a maximum absorption wavelength in a first wavelength region,
the first wavelength region is one of a blue wavelength region, a green wavelength region, a red wavelength region, and an infra-red wavelength region, and
each of the first material and the third material is a light-absorbing material having a maximum absorption wavelength in the first wavelength region.

3. The photoelectric conversion device of claim 1, wherein the third material is included in an amount of less than or equal to about 30% by volume based on a total volume of the first material and the third material.

4. The photoelectric conversion device of claim 1, wherein
a HOMO energy level of the third material is deeper than the HOMO energy level of the first material and within a range of less than or equal to about 0.3 eV than the HOMO energy level of the first material.

5. The photoelectric conversion device of claim 4, wherein
the HOMO energy level of the third material is about 5.1 eV to about 6.0 eV, and
the HOMO energy level of the first material is about 5.0 eV to about 5.8 eV.

6. The photoelectric conversion device of claim 1, wherein at least one of the first material or the second material is an organic material.

7. The photoelectric conversion device of claim 1, wherein the second material includes an inorganic material, a thiophene or a thiophene derivative, a fullerene or a fullerene derivative, or a combination thereof.

8. The photoelectric conversion device of claim 1, wherein the photoelectric conversion layer is a ternary system consisting essentially of the first material, the second material, and the third material.

9. A sensor comprising:
the photoelectric conversion device of claim 1.

10. An electronic device comprising:
the photoelectric conversion device of claim 1.

11. A photoelectric conversion device, comprising
a first electrode and a second electrode; and
a photoelectric conversion layer between the first electrode and the second electrode,
wherein the photoelectric conversion layer includes a mixture of a first material, a second material, and a third material, the first material, the second material, and the third material being different from each other,
each of the first material and the third material is a light-absorbing material configured to selectively absorb light in a first wavelength region, the first wavelength region being one of a blue wavelength region, a green wavelength region, a red wavelength region, and an infra-red wavelength region,
each of the first material and the third material is an organic material, the third material is included in an amount of less than or equal to about 30 volume % based on a total volume of the first material and the third material, the first material is represented by Chemical Formula A-1,

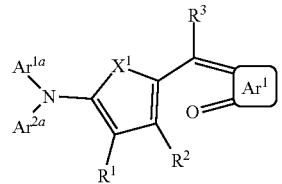

wherein, in Chemical Formula A-1,
$X^1$ is O, S, Se, Te, SO, $SO_2$, $SiR^aR^b$, or $GeR^cR^d$,
$Ar^1$ is a substituted or unsubstituted C6 to C30 arylene group, a substituted or unsubstituted C3 to C30 heterocyclic group, or a fused ring including a combination thereof,
$Ar^{1a}$ and $Ar^{2a}$ independently are hydrogen, deuterium, a substituted or unsubstituted C1 to C30 alkyl group, a substituted or unsubstituted C3 to C30 cycloalkyl group, a substituted or unsubstituted C6 to C30 aryl group, or a substituted or unsubstituted C3 to C30 heteroaryl group,
$Ar^{1a}$ and $Ar^{2a}$ are independently present alone or are linked with each other to form a fused ring, and
$R^1$ to $R^3$ and $R^a$ to $R^d$ independently are hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, or a cyano group, and the third material is represented by Chemical Formula 1-1

[Chemical Formula 1-1]

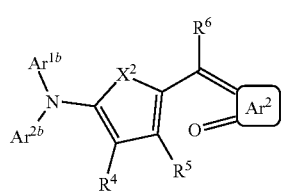

wherein, in Chemical Formula 1-1,
$X^2$ is O, S, Se, Te, SO, $SO_2$, $SiR^aR^b$, or $GeR^cR^d$,
$A^{r2}$ is a substituted or unsubstituted C6 to C30 arylene group, a substituted or unsubstituted C3 to C30 heterocyclic group, or a fused ring including a combination thereof,
$Ar^{1b}$ and $Ar^{2b}$ independently are hydrogen, deuterium, a substituted or unsubstituted C1 to C30 alkyl group, a substituted or unsubstituted C3 to C30 cycloalkyl group, a substituted or unsubstituted C6 to C30 aryl group, or a substituted or unsubstituted C3 to C30 heteroaryl group,
$Ar^{1b}$ and $Ar^{2b}$ are independently present alone or are linked with each other to form a fused ring, and
$R^4$ to $R^6$ and $R^a$ to $R^d$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, or a cyano group.

12. The photoelectric conversion device of claim 11, wherein
the first material and the third material are p-type materials, and
the second material is an n-type material.

13. The photoelectric conversion device of claim 11, wherein
a HOMO energy level of the third material is shallower within a range of less than or equal to about 0.3 eV than a HOMO energy level of the first material,
the HOMO energy level of the third material is about 5.1 eV to about 6.0 eV, and
the HOMO energy level of the first material is about 5.0 eV to about 5.8 eV.

14. The photoelectric conversion device of claim 11, wherein the third material is included in an amount of about 1% by volume to about 10% by volume based on the total volume of the first material and the third material.

15. The photoelectric conversion device of claim 11, wherein
the second material includes an inorganic material, a thiophene or a thiophene derivative, a fullerene or a fullerene derivative, or a combination thereof.

16. The photoelectric conversion device of claim 11, wherein the photoelectric conversion layer is a ternary system consisting essentially of the first material, the second material, and the third material.

17. A sensor comprising:
the photoelectric conversion device of claim 11.

18. An electronic device comprising:
the photoelectric conversion device of claim 11.

19. The photoelectric conversion device of claim 11, wherein the third material has a dipole moment in a range of 5.5 Debye to 15 Debye.

* * * * *